United States Patent
Nikolski et al.

(10) Patent No.: US 12,510,828 B2
(45) Date of Patent: Dec. 30, 2025

(54) METHOD FOR CONTROLLING A MANUFACTURING PROCESS AND ASSOCIATED APPARATUSES

(71) Applicant: ASML Netherlands B.V., Veldhoven (NL)

(72) Inventors: Pioter Nikolski, Veldhoven (NL); Thomas Theeuwes, Veldhoven (NL); Antonio Corradi, Veldhoven (NL); Duan-Fu Stephen Hsu, Fremont, CA (US); Sun Wook Jung, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 174 days.

(21) Appl. No.: 18/157,776

(22) Filed: Jan. 20, 2023

(65) Prior Publication Data
US 2023/0161265 A1 May 25, 2023

Related U.S. Application Data

(63) Continuation of application No. PCT/EP2021/066806, filed on Jun. 21, 2021.
(Continued)

(51) Int. Cl.
*G03F 7/00* (2006.01)

(52) U.S. Cl.
CPC ...... *G03F 7/70525* (2013.01); *G03F 7/70441* (2013.01); *G03F 7/705* (2013.01); *G03F 7/70616* (2013.01); *G03F 7/706837* (2023.05)

(58) Field of Classification Search
CPC .. G03F 7/705; G03F 7/70441; G03F 7/70625; G03F 7/70641; G03F 7/70633;
(Continued)

(56) References Cited

U.S. PATENT DOCUMENTS

| 7,695,876 B2 * | 4/2010 | Ye | G03F 7/705 |
| | | | 430/30 |
| 7,703,069 B1 | 4/2010 | Liu et al. | |

(Continued)

FOREIGN PATENT DOCUMENTS

| EP | 3492983 A1 | 6/2019 |
| EP | 3495888 A1 | 6/2019 |

(Continued)

OTHER PUBLICATIONS

International Search Report issued in related Foreign Application No. PCT/EP2021/066806; mailed Sep. 6, 2021 (2 pgs.).
(Continued)

*Primary Examiner* — Steven H Whitesell
(74) *Attorney, Agent, or Firm* — FINNEGAN, HENDERSON, FARABOW, GARRETT & DUNNER LLP

(57) ABSTRACT

Disclosed is a method of determining a process window within a process space comprising obtaining contour data relating to features to be provided to a substrate across a plurality of layers, for each of a plurality of process conditions associated with providing the features across said plurality of layers and failure mode data describing constraints on the contour data across the plurality of layers. The failure mode data is applied to the contour data to determine a failure count for each process condition; and the process window is determined by associating each process condition to its corresponding failure count. Also disclosed is a method of determining an actuation constrained subspace of the process window based on actuation constraints imposed by the plurality of actuators.

17 Claims, 9 Drawing Sheets

Related U.S. Application Data

(60) Provisional application No. 63/089,822, filed on Oct. 9, 2020.

(58) Field of Classification Search
CPC ............. G03F 7/70616; G03F 7/70525; G03F 7/70508; G03F 7/70483; G03F 7/70491
See application file for complete search history.

(56) References Cited

U.S. PATENT DOCUMENTS

| | | | |
|---|---|---|---|
| 7,941,768 B1* | 5/2011 | Wei .......................... | G03F 7/705 716/54 |
| 2006/0033921 A1 | 2/2006 | Den Boef et al. | |
| 2006/0066855 A1 | 3/2006 | Boef et al. | |
| 2010/0119961 A1* | 5/2010 | Ye .............................. | G03F 1/36 430/30 |
| 2010/0180251 A1* | 7/2010 | Ye .............................. | G03F 1/36 716/53 |
| 2010/0201963 A1 | 8/2010 | Cramer et al. | |
| 2010/0293413 A1* | 11/2010 | Borjon ...................... | G03F 1/36 714/E11.178 |
| 2011/0027704 A1 | 2/2011 | Cramer et al. | |
| 2011/0043791 A1 | 2/2011 | Smilde et al. | |
| 2011/0102753 A1 | 5/2011 | Van De Kerkhof et al. | |
| 2012/0044470 A1 | 2/2012 | Smilde et al. | |
| 2012/0123581 A1 | 5/2012 | Smilde et al. | |
| 2012/0127442 A1* | 5/2012 | Bruce ...................... | G03F 7/705 355/53 |
| 2012/0316855 A1* | 12/2012 | Park ........................ | G06F 30/20 703/13 |
| 2013/0258310 A1 | 10/2013 | Smilde et al. | |
| 2013/0271740 A1 | 10/2013 | Quintanilha | |
| 2015/0227654 A1* | 8/2015 | Hunsche ............. | G03F 7/70525 716/54 |
| 2016/0005157 A1* | 1/2016 | Toyoda ................... | G06T 7/001 382/149 |
| 2016/0274036 A1* | 9/2016 | Plihal ..................... | G03F 7/7065 |
| 2017/0004233 A1* | 1/2017 | Han ...................... | G06F 30/398 |
| 2017/0160648 A1* | 6/2017 | Tel ...................... | G03F 7/70516 |
| 2018/0074413 A1* | 3/2018 | Hunsche ............. | G03F 7/70641 |
| 2018/0329311 A1* | 11/2018 | Cheong ............... | G03F 7/70641 |
| 2019/0137889 A1* | 5/2019 | Tel ........................ | G03F 7/7065 |
| 2020/0278614 A1* | 9/2020 | Werkman ........... | G03F 7/70525 |

FOREIGN PATENT DOCUMENTS

| | | | | |
|---|---|---|---|---|
| WO | WO 2009/106279 A1 | 9/2009 | | |
| WO | WO 2009/148976 A1 | 12/2009 | | |
| WO | WO 2013/178422 A1 | 12/2013 | | |
| WO | WO 2016/142169 A1 | 9/2016 | | |
| WO | WO 2016/202559 A1 | 12/2016 | | |
| WO | WO-2018077651 A1 * | 5/2018 | ............. | G03F 7/705 |
| WO | WO-2018114246 A2 * | 6/2018 | ............. | G03F 7/705 |
| WO | WO 2020/114684 A1 | 6/2020 | | |

OTHER PUBLICATIONS

P. Fanton et al., "Process Window Optimizer for pattern based defect prediction on 28mm Metal Layer".

* cited by examiner (a)

(b)

METHOD FOR CONTROLLING A MANUFACTURING PROCESS AND ASSOCIATED APPARATUSES

CROSS-REFERENCE TO RELATED APPLICATIONS

This application claims priority of International application PCT/EP2021/066806, which was filed on 21 Jun. 2021, which claims priority of EP application 20187251.2, which was filed on 22 Jul. 2020, of EP application 20188802.1, which was filed on 31 Jul. 2020, and of U.S. application 63/089,822 which was filed on 9 Oct. 2020. All of these applications are incorporated herein by reference in their entireties.

FIELD

The embodiments of the present disclosure relate to methods and apparatus for applying patterns to a substrate in a lithographic process.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In order to monitor the lithographic process, parameters of the patterned substrate are measured. Parameters may include, for example, the overlay error between successive layers formed in or on the patterned substrate and critical linewidth (CD) of developed photosensitive resist. This measurement may be performed on a product substrate and/or on a dedicated metrology target. There are various techniques for making measurements of the microscopic structures formed in lithographic processes, including the use of scanning electron microscopes and various specialized tools. A fast and non-invasive form of specialized inspection tool is a scatterometer in which a beam of radiation is directed onto a target on the surface of the substrate and properties of the scattered or reflected beam are measured. Two main types of scatterometer are known. Spectroscopic scatterometers direct a broadband radiation beam onto the substrate and measure the spectrum (intensity as a function of wavelength) of the radiation scattered into a particular narrow angular range. Angularly resolved scatterometers use a monochromatic radiation beam and measure the intensity of the scattered radiation as a function of angle.

Examples of known scatterometers include angle-resolved scatterometers of the type described in US2006033921A1 and US2010201963A1. The targets used by such scatterometers are relatively large, e.g., 40 µm by 40 µm, gratings and the measurement beam generates a spot that is smaller than the grating (i.e., the grating is underfilled). In addition to measurement of feature shapes by reconstruction, diffraction based overlay can be measured using such apparatus, as described in published patent application US2006066855A1. Diffraction-based overlay metrology using dark-field imaging of the diffraction orders enables overlay measurements on smaller targets. Examples of dark field imaging metrology can be found in international patent applications WO 2009/078708 and WO 2009/106279 which documents are hereby incorporated by reference in their entirety. Further developments of the technique have been described in published patent publications US20110027704A, US20110043791A, US2011102753A1, US20120044470A, US20120123581A, US20130258310A, US20130271740A and WO2013178422A1. These targets can be smaller than the illumination spot and may be surrounded by product structures on a wafer. Multiple gratings can be measured in one image, using a composite grating target. The contents of all these applications are also incorporated herein by reference.

In performing lithographic processes, such as application of a pattern on a substrate or measurement of such a pattern, process control methods are used to monitor and control the process. Such process control techniques are typically performed to obtain corrections for control of the lithographic process. It would be desirable to improve such process control methods.

SUMMARY

In some embodiments of the present disclosure, there is provided a method of determining a process window within a process space for a manufacturing process, the process space being defined by a plurality of process parameters, the process window being a subspace within the process space associated with an expected compliance to a processing requirement; the method comprising: obtaining contour data relating to features to be provided to a substrate across a plurality of layers, for each of a plurality of process conditions associated with providing the features across said plurality of layers; obtaining failure mode data describing constraints on the contour data across the plurality of layers; determining a failure count for each process condition by applying the failure mode data to the contour data; and determining the process window by associating each process condition to its corresponding failure count.

In some embodiments of the present disclosure, there is provided a method for configuring a plurality of actuators for actuating a manufacturing process, comprising: obtaining a process window within a process space for a manufacturing process, the process space being defined by a plurality of process parameters, the process window being a subspace within the process space associated with an expected compliance to a processing requirement; determining an actuation constrained subspace of the process window based on actuation constraints imposed by the plurality of actuators; and determining a control strategy for said a plurality of actuators compliant with said actuation constrained subspace In some embodiments of the present disclosure, there is provided a computer program comprising program instructions operable to perform the method of the aforementioned embodiments when run on a suitable apparatus, and a lithographic apparatus which is configured to provide product structures to a substrate in a lithographic process, said lithographic apparatus comprising a processor and the aforementioned computer program.

Further aspects, features and advantages, as well as the structure and operation of various examples, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS

Embodiments will now be described, by way of example, with reference to the accompanying drawings in which.

DETAILED DESCRIPTION

Before describing embodiments in detail, it is instructive to present an example environment in which embodiments of the present disclosure may be implemented.

Figure 1:
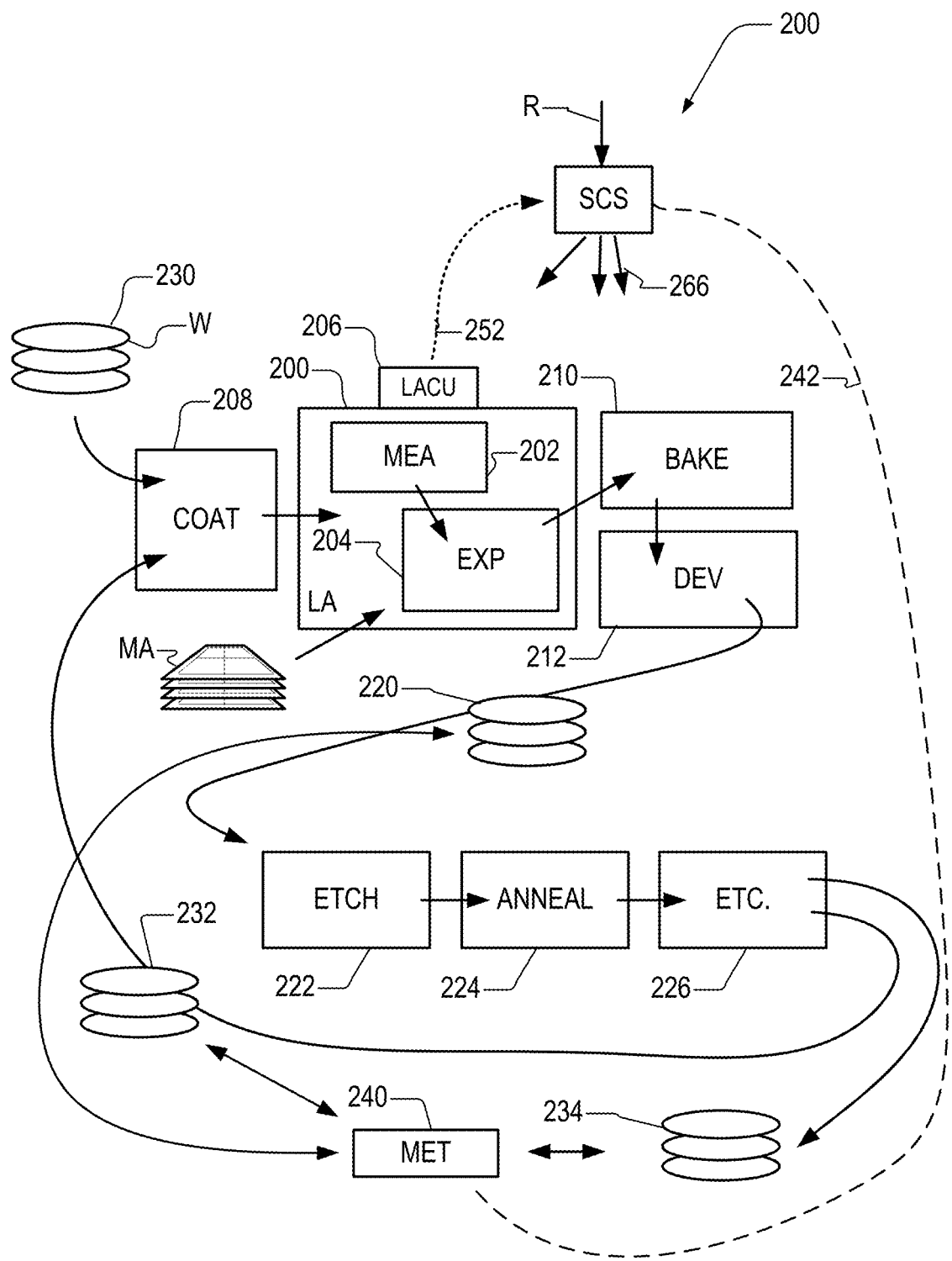
FIG. 1 depicts a lithographic apparatus together with other apparatuses forming a production facility for semiconductor devices.

FIG. 1 at 200 shows a lithographic apparatus LA as part of an industrial production facility implementing a high-volume, lithographic manufacturing process. In the present example, the manufacturing process is adapted for the manufacture of for semiconductor products (integrated circuits) on substrates such as semiconductor wafers. The skilled person will appreciate that a wide variety of products can be manufactured by processing different types of substrates in variants of this process. The production of semiconductor products is used purely as an example which has great commercial significance today.

Within the lithographic apparatus (or "litho tool" 200 for short), a measurement station MEA is shown at 202 and an exposure station EXP is shown at 204. A control unit LACU is shown at 206. In this example, each substrate visits the measurement station and the exposure station to have a pattern applied. In an optical lithographic apparatus, for example, a projection system is used to transfer a product pattern from a patterning device MA onto the substrate using conditioned radiation and a projection system. This is done by forming an image of the pattern in a layer of radiation-sensitive resist material.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. The patterning MA device may be a mask or reticle, which imparts a pattern to a radiation beam transmitted or reflected by the patterning device. Well-known modes of operation include a stepping mode and a scanning mode. As is well known, the projection system may cooperate with support and positioning systems for the substrate and the patterning device in a variety of ways to apply a desired pattern to many target portions across a substrate. Programmable patterning devices may be used instead of reticles having a fixed pattern. The radiation for example may include electromagnetic radiation in the deep ultraviolet (DUV) or extreme ultraviolet (EUV) wavebands. The present disclosure is also applicable to other types of lithographic process, for example imprint lithography and direct writing lithography, for example by electron beam.

The lithographic apparatus control unit LACU which controls all the movements and measurements of various actuators and sensors to receive substrates W and reticles MA and to implement the patterning operations. LACU also includes signal processing and data processing capacity to implement desired calculations relevant to the operation of the apparatus. In practice, control unit LACU will be realized as a system of many sub-units, each handling the real-time data acquisition, processing and control of a subsystem or component within the apparatus.

Before the pattern is applied to a substrate at the exposure station EXP, the substrate is processed in at the measurement station MEA so that various preparatory steps may be carried out. The preparatory steps may include mapping the surface height of the substrate using a level sensor and measuring the position of alignment marks on the substrate using an alignment sensor. The alignment marks are arranged nominally in a regular grid pattern. However, due to inaccuracies in creating the marks and also due to deformations of the substrate that occur throughout its processing, the marks deviate from the ideal grid. Consequently, in addition to measuring position and orientation of the substrate, the alignment sensor in practice must measure in detail the positions of many marks across the substrate area, if the apparatus is to print product features at the correct locations with very high accuracy. The apparatus may be of a so-called dual stage type which has two substrate tables, each with a positioning system controlled by the control unit LACU. While one substrate on one substrate table is being exposed at the exposure station EXP, another substrate can be loaded onto the other substrate table at the measurement station MEA so that various preparatory steps may be carried out. The measurement of alignment marks is therefore very time-consuming and the provision of two substrate tables enables a substantial increase in the throughput of the apparatus. If the position sensor IF is not capable of measuring the position of the substrate table while it is at the measurement station as well as at the exposure station, a second position sensor may be provided to enable the positions of the substrate table to be tracked at both stations. Lithographic apparatus LA may for example is of a so-called dual stage type which has two substrate tables and two stations—an exposure station and a measurement station—between which the substrate tables can be exchanged.

Within the production facility, apparatus 200 forms part of a "litho cell" or "litho cluster" that contains also a coating apparatus 208 for applying photosensitive resist and other coatings to substrates W for patterning by the apparatus 200. At an output side of apparatus 200, a baking apparatus 210 and developing apparatus 212 are provided for developing the exposed pattern into a physical resist pattern. Between all of these apparatuses, substrate handling systems take care of supporting the substrates and transferring them from one piece of apparatus to the next. These apparatuses, which are often collectively referred to as the track, are under the control of a track control unit which is itself controlled by a supervisory control system SCS, which also controls the lithographic apparatus via lithographic apparatus control unit LACU. Thus, the different apparatus can be operated to maximize throughput and processing efficiency. Supervisory control system SCS receives recipe information R which provides in great detail a definition of the steps to be performed to create each patterned substrate.

Once the pattern has been applied and developed in the litho cell, patterned substrates 220 are transferred to other processing apparatuses such as are illustrated at 222, 224, 226. A wide range of processing steps is implemented by various apparatuses in a typical manufacturing facility. For the sake of example, apparatus 222 can be an etching station, and apparatus 224 performs a post-etch annealing step. Further physical and/or chemical processing steps are applied in further apparatuses, 226, etc. Numerous types of operation can be required to make a real device, such as deposition of material, modification of surface material characteristics (oxidation, doping, ion implantation etc.), chemical-mechanical polishing (CMP), and so forth. The apparatus 226 may, in practice, represent a series of different processing steps performed in one or more apparatuses. As another example, apparatus and processing steps may be provided for the implementation of self-aligned multiple patterning, to produce multiple smaller features based on a precursor pattern laid down by the lithographic apparatus.

As is well known, the manufacture of semiconductor devices involves many repetitions of such processing, to build up device structures with appropriate materials and patterns, layer-by-layer on the substrate. Accordingly, substrates 230 arriving at the litho cluster may be newly prepared substrates, or they may be substrates that have been processed previously in this cluster or in another apparatus entirely. Similarly, depending on the required processing, substrates 232 on leaving apparatus 226 may be returned for a subsequent patterning operation in the same litho cluster, they may be destined for patterning operations in a different cluster, or they may be finished products to be sent for dicing and packaging.

Each layer of the product structure requires a different set of process steps, and the apparatuses 226 used at each layer may be completely different in type. Further, even where the processing steps to be applied by the apparatus 226 are nominally the same, in a large facility, there may be several supposedly identical machines working in parallel to perform the step 226 on different substrates. Small differences in set-up or faults between these machines can mean that they influence different substrates in different ways. Even steps that are relatively common to each layer, such as etching (apparatus 222) may be implemented by several etching apparatuses that are nominally identical but working in parallel to maximize throughput. In practice, moreover, different layers require different etch processes, for example chemical etches, plasma etches, according to the details of the material to be etched, and special requirements such as, for example, anisotropic etching.

The previous and/or subsequent processes may be performed in other lithography apparatuses, as just mentioned, and may even be performed in different types of lithography apparatus. For example, some layers in the device manufacturing process which are very demanding in parameters such as resolution and overlay may be performed in a more advanced lithography tool than other layers that are less demanding. Therefore some layers may be exposed in an immersion type lithography tool, while others are exposed in a 'dry' tool. Some layers may be exposed in a tool working at DUV wavelengths, while others are exposed using EUV wavelength radiation.

In order that the substrates that are exposed by the lithographic apparatus are exposed correctly and consistently, it is desirable to inspect exposed substrates to measure properties such as overlay errors between subsequent layers, line thicknesses, critical dimensions (CD), etc. Accordingly a manufacturing facility in which litho cell LC is located also includes metrology system which receives some or all of the substrates W that have been processed in the litho cell. Metrology results are provided directly or indirectly to the supervisory control system SCS. If errors are detected, adjustments may be made to exposures of subsequent substrates, especially if the metrology can be done soon and fast enough that other substrates of the same batch are still to be exposed. Also, already exposed substrates may be stripped and reworked to improve yield, or discarded, thereby avoiding performing further processing on substrates that are known to be faulty. In a case where only some target portions of a substrate are faulty, further exposures can be performed only on those target portions which are good.

Also shown in FIG. 1 is a metrology apparatus 240 which is provided for making measurements of parameters of the products at desired stages in the manufacturing process. A common example of a metrology station in a modern lithographic production facility is a scatterometer, for example a dark-field scatterometer, an angle-resolved scatterometer or a spectroscopic scatterometer, and it may be applied to measure properties of the developed substrates at 220 prior to etching in the apparatus 222. Using metrology apparatus 240, it may be determined, for example, that important performance parameters such as overlay or critical dimension (CD) do not meet specified accuracy requirements in the developed resist. Prior to the etching step, the opportunity exists to strip the developed resist and reprocess the substrates 220 through the litho cluster. The metrology results 242 from the apparatus 240 can be used to maintain accurate performance of the patterning operations in the litho cluster, by supervisory control system SCS and/or control unit LACU 206 making small adjustments over time, thereby minimizing the risk of products being made out-of-specification and requiring re-work.

Additionally, metrology apparatus 240 and/or other metrology apparatuses (not shown) can be applied to measure properties of the processed substrates 232, 234, and incoming substrates 230. The metrology apparatus can be used on the processed substrate to determine important parameters such as overlay or CD.

A metrology apparatus suitable for use in embodiments of the present disclosure is shown in FIG. 2(a). A target T and diffracted rays of measurement radiation used to illuminate the target are illustrated in more detail in FIG. 2(b). The metrology apparatus illustrated is of a type known as a dark field metrology apparatus. The metrology apparatus may be a stand-alone device or incorporated in either the lithographic apparatus LA, e.g., at the measurement station, or the lithographic cell LC. An optical axis, which has several branches throughout the apparatus, is represented by a dotted line O. In this apparatus, light emitted by source 11 (e.g., a xenon lamp) is directed onto substrate W via a beam splitter 15 by an optical system comprising lenses 12, 14 and objective lens 16. These lenses are arranged in a double sequence of a 4F arrangement. A different lens arrangement can be used, provided that it still provides a substrate image onto a detector, and simultaneously allows for access of an intermediate pupil-plane for spatial-frequency filtering. Therefore, the angular range at which the radiation is incident on the substrate can be selected by defining a spatial intensity distribution in a plane that presents the spatial spectrum of the substrate plane, here referred to as a (conjugate) pupil plane. In particular, this can be done by inserting an aperture plate 13 of suitable form between lenses 12 and 14, in a plane which is a back-projected image of the objective lens pupil plane. In the example illustrated, aperture plate 13 has different forms, labeled 13N and 13S, allowing different illumination modes to be selected. The illumination system in the present examples forms an off-axis illumination mode. In the first illumination mode, aperture plate 13N provides off-axis from a direction designated, for the sake of description only, as 'north'. In a second illumination mode, aperture plate 13S is used to provide similar illumination, but from an opposite direction, labeled 'south'. Other modes of illumination are possible by using different apertures. The rest of the pupil plane is desirably dark as any unnecessary light outside the desired illumination mode will interfere with the desired measurement signals.

As shown in FIG. 2(b), target T is placed with substrate W normal to the optical axis O of objective lens 16. The substrate W may be supported by a support (not shown). A ray of measurement radiation I impinging on target T from an angle off the axis O gives rise to a zeroth order ray (solid line 0) and two first order rays (dot-chain line +1 and double dot-chain line −1). It should be remembered that with an overfilled small target, these rays are just one of many parallel rays covering the area of the substrate including metrology target T and other features. Since the aperture in plate 13 has a finite width (necessary to admit a useful quantity of light, the incident rays I will in fact occupy a range of angles, and the diffracted rays 0 and +1/−1 will be spread out somewhat. According to the point spread function of a small target, each order +1 and −1 will be further spread over a range of angles, not a single ideal ray as shown. Note that the grating pitches of the targets and the illumination angles can be designed or adjusted so that the first order rays entering the objective lens are closely aligned with the central optical axis. The rays illustrated in FIGS. 2(a) and 2(b) are shown somewhat off axis, purely to enable them to be more easily distinguished in the diagram.

At least the 0 and +1 orders diffracted by the target T on substrate W are collected by objective lens 16 and directed back through beam splitter 15. Returning to FIG. 2(a), both the first and second illumination modes are illustrated, by designating diametrically opposite apertures labeled as north (N) and south (S). When the incident ray I of measurement radiation is from the north side of the optical axis, that is when the first illumination mode is applied using aperture plate 13N, the +1 diffracted rays, which are labeled +1(N), enter the objective lens 16. In contrast, when the second illumination mode is applied using aperture plate 13S the −1 diffracted rays (labeled −1(S)) are the ones which enter the lens 16.

A second beam splitter 17 divides the diffracted beams into two measurement branches. In a first measurement branch, optical system 18 forms a diffraction spectrum (pupil plane image) of the target on first sensor 19 (e.g. a CCD or CMOS sensor) using the zeroth and first order diffractive beams. Each diffraction order hits a different point on the sensor, so that image processing can compare and contrast orders. The pupil plane image captured by sensor 19 can be used for many measurement purposes such as reconstruction used in methods described herein. The pupil plane image can also be used for focusing the metrology apparatus and/or normalizing intensity measurements of the first order beam.

In the second measurement branch, optical system 20, 22 forms an image of the target T on sensor 23 (e.g. a CCD or CMOS sensor). In the second measurement branch, an aperture stop 21 is provided in a plane that is conjugate to the pupil-plane. Aperture stop 21 functions to block the zeroth order diffracted beam so that the image of the target formed on sensor 23 is formed only from the −1 or +1 first order beam. The images captured by sensors 19 and 23 are output to processor PU which processes the image, the function of which will depend on the particular type of measurements being performed. Note that the term 'image' is used here in a broad sense. An image of the grating lines as such will not be formed, if only one of the −1 and +1 orders is present.

Figure 2:
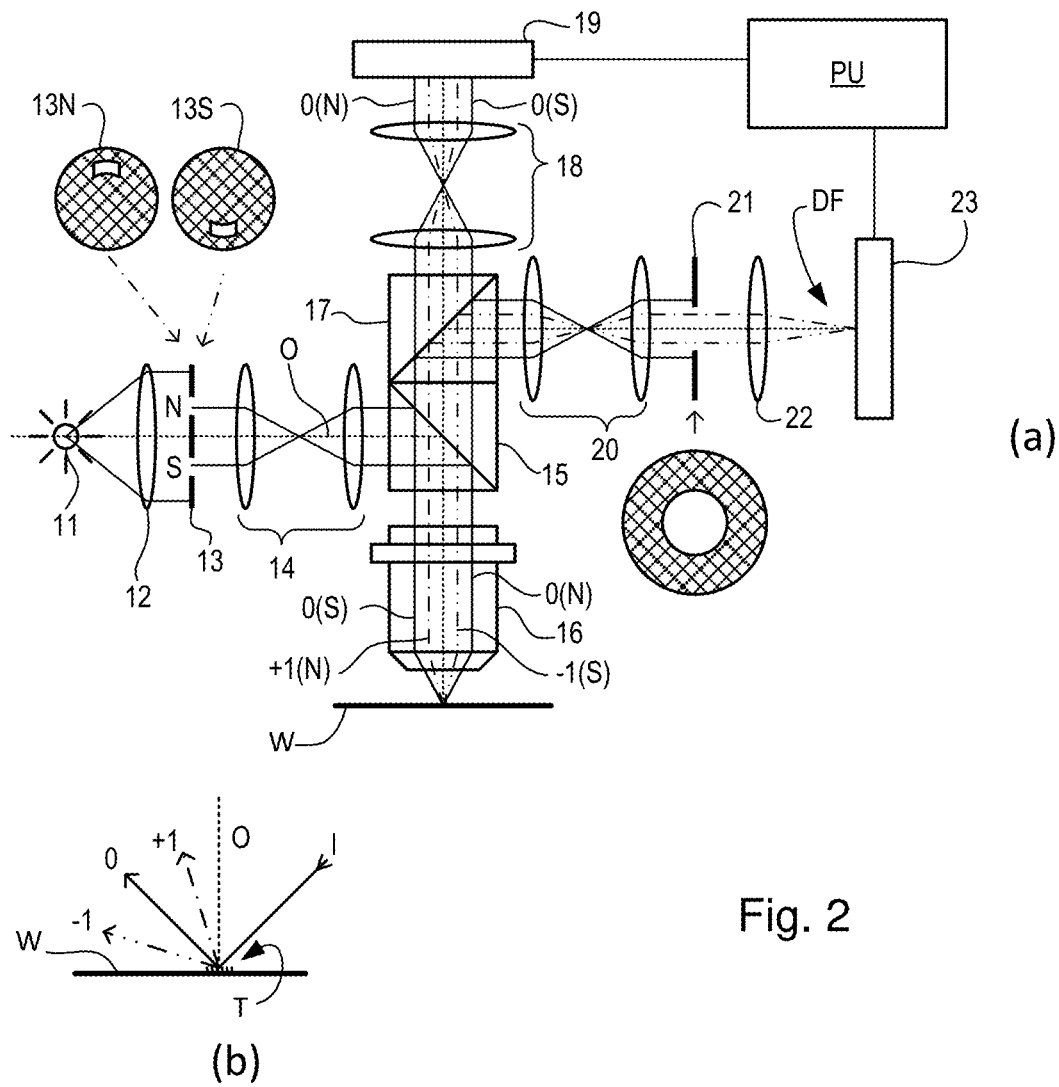
FIG. 2 comprises a schematic diagram of a scatterometer for use in measuring targets according to some embodiments of the present disclosure.

The particular forms of aperture plate 13 and field stop 21 shown in FIG. 2 are purely examples. In some embodiments of the present disclosure, on-axis illumination of the targets is used, and an aperture stop with an off-axis aperture is used to pass substantially only one first order of diffracted light to the sensor. In yet other embodiments, $2^{nd}$, $3^{rd}$ and higher order beams (not shown in FIG. 2) can be used in measurements, instead of or in addition to the first order beams.

The target T may comprise a number of gratings, which may have differently biased overlay offsets in order to facilitate measurement of overlay between the layers in which the different parts of the composite gratings are formed. The gratings may also differ in their orientation, so as to diffract incoming radiation in X and Y directions. In one example, a target may comprise two X-direction gratings with biased overlay offsets +d and −d, and Y-direction gratings with biased overlay offsets +d and −d. Separate images of these gratings can be identified in the image captured by sensor 23. Once the separate images of the gratings have been identified, the intensities of those individual images can be measured, e.g., by averaging or summing selected pixel intensity values within the identified areas. Intensities and/or other properties of the images can be compared with one another. These results can be combined to measure different parameters of the lithographic process Various techniques may be used to improve the accuracy of reproduction of patterns onto a substrate. Accurate reproduction of patterns onto a substrate is not the only concern in the production of ICs. Another concern is the yield, which generally measures how many functional devices a device manufacturer or a device manufacturing process can produce per substrate. Various approaches can be employed to enhance the yield. One such approach attempts to make the production of devices (e.g., imaging a portion of a design layout onto a substrate using a lithographic apparatus such as a scanner) more tolerant to perturbations of at least one of the processing parameters during processing a substrate, e.g., during imaging of a portion of a design layout onto a substrate using a lithographic apparatus. The concept of overlapping process window (OPW) is a useful tool for this approach. The production of devices (e.g., ICs) may include other steps such as substrate measurements before, after or during imaging, loading or unloading of the substrate, loading or unloading of a patterning device, positioning of a die underneath the projection optics before exposure, stepping from one die to another, etc. Further, various patterns on a patterning device may have different process windows (i.e., a space of processing parameter values under which a pattern will be produced within specification). Examples of pattern specifications which relate to a potential systematic defect include necking, line pull back, line thinning, CD errors, edge placement errors, overlapping, resist top loss, resist undercut and/or bridging. The process window of all or some (usually patterns within a particular area) of the patterns on a patterning device may be obtained by merging (e.g., overlapping) process windows of each individual pattern. The process window of these patterns is thus called an overlapping process window. The boundary of the OPW may contain boundaries of process windows of some of the individual patterns. In another words, these individual patterns limit the OPW. These individual patterns can be referred to as "hotspots" or "critical features" which are used interchangeably herein. When controlling a lithography process, it is possible, and typically economical, to focus on the hotspots. When the hotspots are not defective, it is likely that all the patterns are not defective. The imaging becomes more tolerant to perturbations when values of the processing parameters are closer to the OPW if the values of the processing parameters are outside the OPW, or when the values of the processing parameters are farther away from the boundary of the OPW if the values of the processing parameters are inside the OPW.

Figure 3:
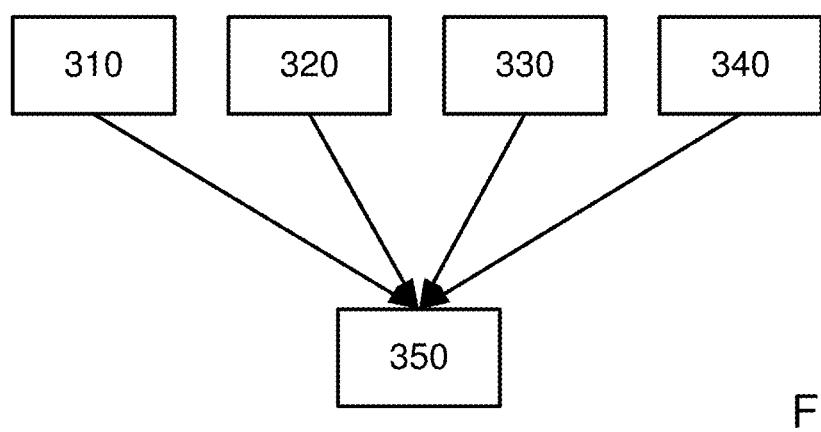
FIG. 3 shows exemplary sources of processing parameters.

FIG. 3 shows exemplary sources of processing parameters 350. One source may be data 310 of the processing apparatus, such as parameters of the source, projection optics, substrate stage, etc. of a lithography apparatus, of a track, etc. Another source may be data 320 from various substrate metrology tools, such as a substrate height map, a focus map, a critical dimension uniformity (CDU) map, etc. Data 320 may be obtained before the applicable substrate was subject to a step (e.g., development) that prevents reworking of the substrate. Another source may be data 330 from one or more patterning device metrology tools, patterning device CDU map, patterning device (e.g., mask) film stack parameter variation, etc. Yet another source may be data 340 from an operator of the processing apparatus.

Figure 4:
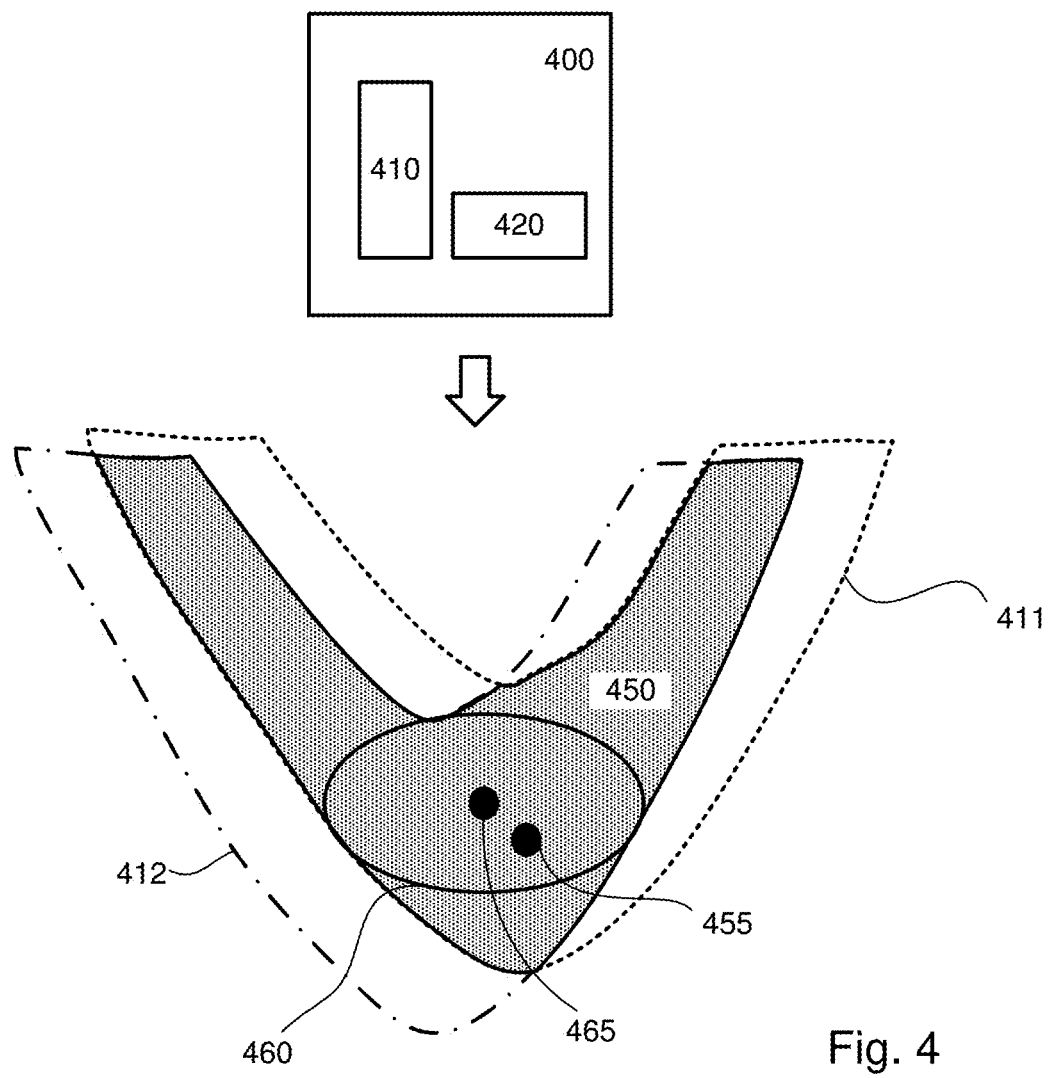
FIG. 4 schematically illustrates a concept of an overlapping process window (OPW)

FIG. 4 schematically illustrates the concept of an OPW. To illustrate the concept, an area, or grid element/pixel, 400 on the patterning device is assumed to have only two individual patterns 410 and 420. The area may include many more patterns. The process windows for the individual patterns 410 and 420 are 411 and 412, respectively. To illustrate the concept, the processing parameters are assumed to only include focus (horizontal axis) and dose (vertical axis). The processing parameters may however include any suitable parameters. The OPW 450 of the area can be obtained by finding the overlap between process windows 411 and 412. The OPW 450 is represented as the shaded area in FIG. 4. The OPW 450 can have an irregular shape. However, in order to easily represent the OPW and to easily determine whether a set of processing parameter values are within the OPW, a "fitted OPW" (e.g., ellipse 460) may be used instead. The "fitted OPW" can be, for example, the largest hyperellipsoid (e.g., ellipse in 2-dimensional processing parameter space as in this example, ellipsoid 3-dimensional processing parameter space, etc.) that fits inside the OPW. Using the "fitted OPW" tends to reduce the computational cost but does not take advantage of the full size of the OPW.

The values of the processing parameters may be selected such that they stay away from the boundary of the OPW or the fitted OPW, in order to decrease the chance that the processing parameters shift outside the OPW and thereby cause defects and decrease the yield. One approach of selecting the values of the processing parameters includes, before actual imaging, (1) optimizing the lithographic apparatus (e.g., optimizing the source and projection optics) and optimizing the design layout, (2) determining the OPW or fitted OPW (e.g., by simulation), and (3) determining a point in the space of the processing parameters (i.e., determining the values of the processing parameters) that is as far away as possible from the boundary of the OPW or fitted OPW (this point may be called the "center" of the OPW or fitted OPW). In the example of FIG. 4, point 455 is the point in the processing parameter space that is as far away as possible from the boundary of the OPW 450 and point 465 is the point in the processing parameter space that is as far away as possible from the boundary of the fitted OPW 460. Point 455 and point 465 may be referred to as the nominal condition. During or before imaging, if the processing parameters shift away from point 455 or point 465, towards the boundary of the OPW or even to the outside the boundary of the OPW, it would be beneficial to have the capability of realizing such a shift and to make appropriate corrections to put the processing parameters back into the OPW and away from its boundary, desirably without interrupting the imaging or other processing.

During or before the actual imaging, the processing parameters may have a perturbation that causes them to deviate from the point that is as far away as possible from the boundary of the OPW or fitted OPW. For example, the focus may change due to topography of a substrate to be exposed, drift in the substrate stage, deformation of the projection optics, etc.; the dose may change to due drift in the source intensity, dwell time, etc. The perturbation may be large enough to cause processing parameters to be outside the OPW, and thus may lead to defects. Various techniques may be used to identify a processing parameter that is perturbed and to correct that processing parameter. For example, if the focus is perturbed, e.g., because an area of the substrate that is slightly raised from the rest of the substrate is being exposed, the substrate stage may be moved or tilted to compensate for the perturbation.

Control of the lithographic process are typically based on measurements fed back or fed forward and then modelled using, for example interfield (across-substrate fingerprint) or intrafield (across-field fingerprint) models. Within a die, there may be separate functional areas such as memory areas, logic areas, contact areas etc. Each different functional area, or different functional area type may have a different process window, each with a different processes window center. For example, different functional area types may have different heights, and therefore different best focus settings. Also, different functional area types may have different structure complexities and therefore different focus tolerances (focus process windows) around each best focus. However, each of these different functional areas may typically be formed using the same focus (or dose or position etc.) setting due to control grid resolution limitations.

The lithographic control may be typically performed using offline calculation of one or more set-point corrections for one or more particular control degrees of freedom, based on (for example) measurements of previously formed structures. The set-point corrections may comprise a correction for a particular process parameter, and may comprise the correction of a setting of a particular degree of freedom to compensate for any drift or error such that the measured process parameter remains within specification (e.g., within an allowed variation from a best setpoint or best value; for example, an OPW or process window). For example, an important process parameter is focus, and a focus error may manifest itself in a defective structure being formed on a substrate. In a typical focus control loop, a focus feedback methodology may be used. Such a methodology may comprise a metrology step which may measure the focus setting used on a formed structure; e.g., by using diffraction based focus (DBF) techniques in which a target with focus dependent asymmetry is formed such that the focus setting can be subsequently determined by measurement of the asymmetry on the target. The measured focus setting may then be used to determine, offline, a correction for the lithographic process; for example a positional correction for one or both of the reticle stage or substrate stage which corrects the focus offset (defocus). Such an offline positional correction may then be conveyed to the scanner as a set-point best focus correction or correction recipe, for direct actuation by the scanner. The measurements may be obtained over a number of lots, with an average (over the lots) best focus correction applied to each substrate of one or more subsequent lots. Control methods are described, for example, in EP3495888 which is incorporated herein by reference.

Figure 5:
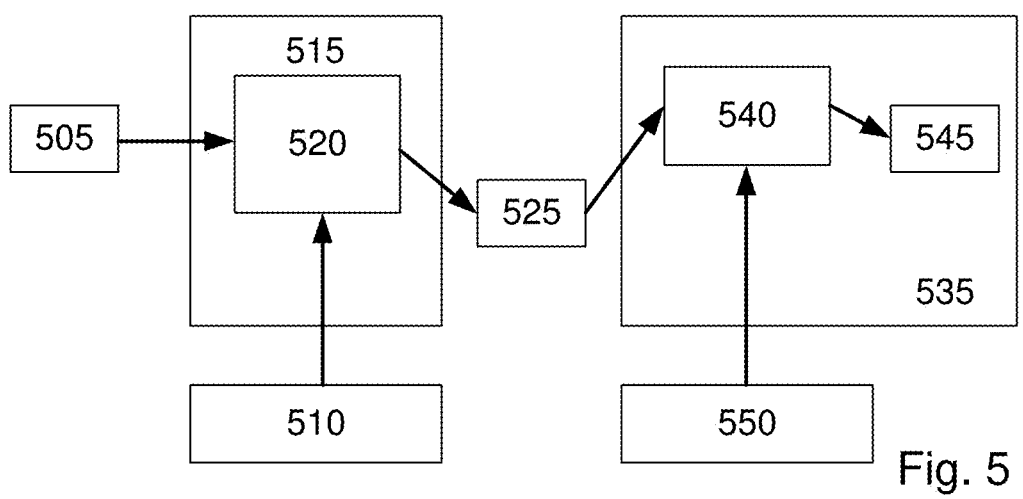
FIG. 5 illustrates schematically a method of determining corrections for control of a lithographic apparatus.

FIG. 5 illustrates such a methodology. It shows product information 505, such as product layout, illumination mode, product micro-topography etc., and metrology data 510 (e.g., defocus data or overlay data measured from previously produced substrates) being fed to an offline processing device 515 which performs an optimization algorithm 520. The output of the optimization algorithm 520 comprises one or more set-point corrections or correction recipes 525, e.g., for actuators which control reticle stage and/or substrate stage positioning within scanner 535. The set-point corrections 525 typically comprise simple correction offsets calculated to compensate for any offset errors (e.g., defocus, dose or overlay offset errors) comprised within the metrology data 510. The corrections for control reticle stage and/or substrate stage positioning may be, for example, control corrections in any direction, i.e., in the x, y and/or z directions, where x and y define the substrate plane and z is perpendicular to this plane. More specifically, they may comprise x/y direction corrections which correct for overlay/alignment errors, and/or z direction corrections which correct for focus errors. A control algorithm 540 (e.g., leveling algorithm) calculates control set-points 545 using substrate specific or inline metrology data 550. For example, a leveling exposure trajectory (e.g., determining a relative movement or acceleration profile for positioning of the substrate stage relative to the reticle stage during the lithographic process) may be calculated using leveling data (e.g., a wafer height map) and outputs positional set-points 545 for the scanner actuators. The scanner 535 directly applies, equally for each substrate, the set-point corrections (offsets) 525 to the calculated set-points 545.

In other embodiments an optimization may be performed in real-time for such process parameters to determine corrections (e.g., corrected set-points), for example, on a per-substrate and/or per-layer basis. Therefore, instead of calculating a set-point correction offline based on (e.g., offline metrology) and feeding this set-point correction forward to the scanner, an optimization sub-recipe (e.g., a suitable optimization function) may be calculated based on the offline metrology, with the actual optimization performed and set-points calculated within the scanner (additional set-point corrections may optionally be calculated offline), using the results of any per substrate metrology.

A conventional optimization strategy may comprise a least-squares minimization or other minimization which applies an averaged optimization across the substrate based on a difference or residual from an actual value and a set point value. Another strategy which may have advantages over a least-squares strategy may comprise a "dies-in-spec" optimization. This aims to maximize the number of dies that are within specification, rather than an overall or average residual across a substrate. As such, a "dies-in-spec" optimization uses prior knowledge of the product (the die layout) when optimizing the process parameter. A least squares optimization typically treats each location equally, without taking into account the die layout. Because of this, a least squares optimization may prefer a correction which "only" results in four locations being out-of-specification, but each in a different die, over a correction which has seven locations out-of-specification, but which only affect two dies (e.g., four defects in one die, three in another). However, as only a single defect will tend to render a die defective, maximizing the number of defect-free dies (i.e., dies-in-spec) is ultimately more important than simply minimizing the number of defects or average residual per substrate.

One type of dies-in-spec optimization which may comprise a maximum absolute (max abs) per die optimization. Such a max abs optimization may minimize the maximum deviation of the performance parameter from a control target. This should produce a solution, but does not prevent dies being out of spec (only attempts to minimize the number of dies-in-spec). As such, other strategies may be preferred, such as constraint limited strategies, where the objective (goal) is formulated in a way that comprises adding constraints to the optimization problem; e.g., such that one or more parameters or metrics are constrained within a range; i.e., they are not allowed to be out-of-spec.

However, there are other constraints such as the physical constraints of the system, such as field size and constraints in what can be varied per field, slit width and constraints in what can be varied per slit, actuation constraints in how stages can physically move etc. The result of this, is that for some constrained optimization problems, there is simply no solution; i.e., the optimization problem is infeasible such that no solutions satisfy all the constraints. In these cases the optimization solver simply cannot produce a result and send out a recipe to e.g., the scanner.

To enable understanding of how a patterning process works, computational lithography techniques can be used to simulate how one or more aspects of the patterning process "work." Thus, appropriate computational lithography software can predict one or more characteristics of the formation of a pattern on a substrate, such as a predicted CD, predicted contour, etc. of the pattern, and possibly do so at different stages of the formation of the pattern. This may comprise using various models which model the one or more aspects of the patterning process. For example, an illumination model may represent optical characteristics (including radiation intensity distribution and/or phase distribution) of the illumination. A projection optics model may represent optical characteristics (including changes to the radiation intensity distribution and/or the phase distribution caused by the projection optics) of the projection optics. A design layout model may represent optical characteristics (including changes to the radiation intensity distribution and/or the phase distribution caused by a given design layout) of a design layout, which is the representation of an arrangement of features on or formed by a patterning device.

An aerial image can be simulated using the illumination model, the projection optics model and the design layout model. A resist image can be simulated from the aerial image using a resist model. Simulation of lithography can, for example, predict contours and/or CDs in the resist image.

More specifically, it is noted that the illumination model can represent the optical characteristics of the illumination that include, but not limited to, NA-sigma ($\sigma$) settings as well as any particular illumination shape (e.g. off-axis illumination such as annular, quadrupole, dipole, etc.). The projection optics model can represent the optical characteristics of the of the projection optics, include, for example, aberration, distortion, a refractive index, a physical size or dimension, etc. The design layout model can also represent one or more physical properties of a physical patterning device, as described, for example, in U.S. Pat. No. 7,587,704, which is incorporated by reference in its entirety. Optical properties associated with the lithographic projection apparatus (e.g., properties of the illumination, the patterning device and the projection optics) dictate the aerial image. Since the patterning device used in the lithographic projection apparatus can be changed, it is desirable to separate the optical properties of the patterning device from the optical properties of the rest of the lithographic projection apparatus including at least the illumination and the projection optics, and hence design layout model.

The resist model can be used to calculate the resist image from the aerial image, an example of which can be found in U.S. Pat. No. 8,200,468, which is hereby incorporated by reference in its entirety. The resist model is typically related only to properties of the resist layer (e.g., effects of chemical processes which occur during exposure, post-exposure bake and/or development).

The objective of the simulation may be to accurately predict, for example, edge placements, aerial image intensity slopes, CDs and/or contours, which can then be compared against an intended design. The intended design is generally defined as a pre-OPC design layout.

From the design layout, one or more portions may be identified, which are referred to as "clips". In some embodiments, a set of clips is extracted, which represents the complicated patterns in the design layout (typically about 50 to 1000 clips, although any number of clips may be used). As will be appreciated by those skilled in the art, these patterns or clips represent small portions (e.g., circuits, cells, etc.) of the design and especially the clips represent small portions for which particular attention and/or verification is needed. In other words, clips may be the portions of the design layout or may be similar or have a similar behavior of portions of the design layout where critical features or hotspots are identified either by experience, by trial and error, or by running a full-chip simulation. Clips often contain one or more test patterns or gauge patterns.

In some examples, the simulation and modeling can be used to configure one or more features of the patterning device pattern (e.g., performing optical proximity correction), one or more features of the illumination (e.g., changing one or more characteristics of a spatial/angular intensity distribution of the illumination, such as change a shape), and/or one or more features of the projection optics (e.g., numerical aperture, etc.). Such configuration can be generally referred to as, respectively, mask optimization, source optimization and projection optimization. Such optimizations can be performed on their own or combined in different combinations. One such example is source-mask optimization (SMO) involves the configuring of one or more features of the patterning device pattern together with one or more features of the illumination. The optimization techniques may focus on one or more of the clips. The optimizations may use the simulations described herein to produce values of various parameters.

It is important to identify features or combinations of integrated circuit (IC) designs which are more likely to fail or create a defect (e.g., hotspots). EPE defects have a multilayer nature and typically caused by one or more CD and/or OVL variations. Methods for accurately identifying and ranking these hotspots prior to wafer fabrication, e.g., using computational lithography methods are highly sought. EPE specific failure mechanism interactions between layers resultant from, for example interlayer geometry, crosstalk of contributors etc., puts additional constraints on EPE process window and hotspot detection and ranking which are not captured or accounted for presently.

The above described computational lithography based hotspot detection is presently based on calculations relating to a single layer. However, in general such single layer hotspot detection may not be sufficiently representative for multi-layer products, as either: a) single layer hotspots may not necessarily be a problem for multilayer hotspots (i.e., functioning of the multilayer product) b) single layer performance may be constrained by other layer contour variability, e.g. cross-talk between layers occurs. Direct measurement of edge placement error (EPE) from the actual product for hotspot detection is possible, e.g., using multi-layer E-beam inspection; however E-beam inspection is too slow for high volume manufacturing.

Therefore it is proposed to perform hotspot detection and/or ranking based on the definition of a multi-dimensional, multiple layer process window (e.g., focus, exposure and overlay or an FEO PW), which takes into account process crosstalk and multiple layer interaction. More specifically, the method may comprise performing a hotspot detection using a multi-dimensional, multi-layer process window which accounts for constraints on contour positions/dimensions for all layers of interest, e.g., taking into account interactions between layers and/or interaction between process condition parameters (e.g. overlay, dose and focus or FEO space).

For example, the method may comprise obtaining multiple layer contour data (which may comprise measured and/or simulated contours) for many process conditions, which, for example may vary in terms of two or more of: focus, dose, overlay or any other process parameter. Other process parameters may include, for example any controllable scanner parameters such as aberrations, or other non-scanner parameters of the IC manufacturing process e.g., duration and temperature for Etch/Patterning processes. It may be appreciated that any crosstalks between layers and/or process parameters will be naturally accounted in the experimental contours extracted from images obtained via measurement e.g., via SEM metrology and contour extraction algorithms. Additionally, a computational lithography model, and therefore simulated contours, may also be designed to take into account such crosstalks. Present methods which do not account for such crosstalks, may lead to overestimation of the OPW and therefore missed critical hotspots and a mismatch between hotspot prediction and verification.

A specific example of a crosstalk not presently accounted for but may be accounted for using the methods disclosed herein, is overlay to imaging crosstalk. Overlay setup for the layers of a particular EPE use case may be used to estimate MSD (moving standard deviation) resultant from the overlay-driven (or moving average MA-driven) stage, lens etc. Resulting MSD may be used as input to the imaging model to predict critical dimension uniformity (CDU), local critical dimension uniformity (LCDU) etc., and is therefore also overlay-driven. As such, aggressive overlay corrections (e.g., 3rd order through slit) will increase MSD (and therefore fading errors) and increase LCDU; As a result, extending a multi-layer, multi-dimensional, multi-layer process window in the overlay dimension would result in its reduction in the CD dimension, depending on the chosen process setup and overlay correction strategy. Such a crosstalk is naturally accounted in the experimental contours extracted from measurements.

The measured and/or simulated contours may be stacked per process condition. Contour stacking, which is described in PCT publication WO2020094286A1 (incorporated herein by reference) and may be used to derive the variability of the contours. The method may comprise obtaining one or more images of parts of a substrate on each of a plurality of layers of the substrate. A variability metric such as overlay margin may be calculated in dependence on the properties of the features, such as the contours of the features. The images relating to one or more corresponding images of the same feature in different layers of a substrate and/or images of a plurality of features on the same layer of a substrate may be stacked (e.g. aligned and overlaid). The alignment process may be based on aligning the images in dependence on one or more reference positions in, or superimposed onto, each of the images so that there is no overlay error between the images. For example, the alignment process may comprise aligning the target designs of the features in the images so that there is no overlay error between the target designs. The alignment process may be based on aligning the images in dependence on intended design data (e.g., GDS data). The effect of performing the alignment process is to remove the effects of any overlay error between the different images. The overlay margin is a measure of the stochastic variation of features in the stack of aligned images. The overlay margin may be calculated in dependence on the differences between the contours of corresponding features in the aligned versions of the images. The overlay margin may also be calculated in dependence on the target contours for the features. For example, for each of the images, the overlay margin may be calculated in dependence on a comparison of the feature in the image with the target of the feature. The differences between the contours of features in an image and the contours of features in other images, as well as target contours for the features, can be determined by a plurality of well-known specific image-related metrics, such as critical dimension uniformity (CDU), line width roughness (LWR), critical dimension amplitude and placement errors.

Based on performance data (e.g., overlay data or other performance parameter data) and failure mode data per processing condition, a failure count is determined (e.g., a count of the instances where the constraints are not met) per process condition. The failure mode data may be EPE failure mode data comprising multi-layer contour constraints which describe contours and contour combinations over multiple layers which are indicative of a (non-yielding) defect. In this way a multi-dimensional EPE failure count based multi-layer process window (PW) may be determined which takes into account interaction between the layers and individual process conditions. Such a PW window may be defined as a process condition region having no predicted failures, or a failure probability below a threshold.

Based on this multilayer process window, hotspots can be identified; e.g., regions comprising or being associated with a small process window volume or space. Furthermore, the multi-layer OPW provides a method for guiding correction strategies (e.g. co-optimizing in FEO space), for example to rank EPE correction strategies. This provides an additional advantage of hotspot identification and verification based on the same EPE based method.

As such, in some embodiments, a method of determining a process window can comprise: obtaining contour data of features provided to a substrate across a plurality of layers; obtaining failure mode data comprising constraints on the contour data across the plurality of layers; obtaining a plurality of process conditions associated with providing the features across said plurality of layers; determining for each process condition a failure count by associating the contour data to its corresponding process condition and subsequently applying the constraints to the contour data; and associating each process condition to their corresponding failure count to obtain a process window.

Hotspots may be determined as features comprising no multi-layer process window, or a small multi-layer process window. For example, hotspots can be determined as any feature comprising a multi-layer process window smaller than a threshold value. Alternatively or in addition, the features may all be ranked according to predicted multi-layer process window size, with those n (where n is any number) features having the smallest process window being identified as hotspots. From the identified hotspots, the overall EPE process window can be found as the overlapping multi-dimensional (e.g., FEO), multi-layer volume of all identified hotspots.

The multi-dimensional, multi-layer PW can help with troubleshooting by pointing to the most critical contributor (e.g., layer 1 or layer 2 CD, OVLx or OVLy) limiting the PW, therefore enabling immediate corrective actions to be taken.

The same approach may be used for simulated contour data and measured contour data. In the former example, the contour data may comprise computational lithography generated simulated contour data. In this way a computational lithography hotspot prediction is possible. In such a method, the simulated contours and overlay fingerprints (measured or simulated) through different process conditions may be used as an input for lithography simulation prior to wafer fabrication. Contour-based analysis for pixel size of 1 nm and below is possible with precise lithography simulations. For measured contour data and wafer-based hotspot detection, measured EPE contours and measured (e.g., in-device metrology) overlay through process conditions may be the input for the hotspot verification. Such a method can be used in high-volume manufacturing with simulated contours and/or sufficiently fast EPE contour metrology.

Proposed hotspot detection and ranking approach could be used to rank EPE solutions and process options (setups) with overlapping multi-layer process window volume being predicted per solution, where the solutions may comprise, for example, different imaging, overlay correction strategies, resists etc.

Figure 6:
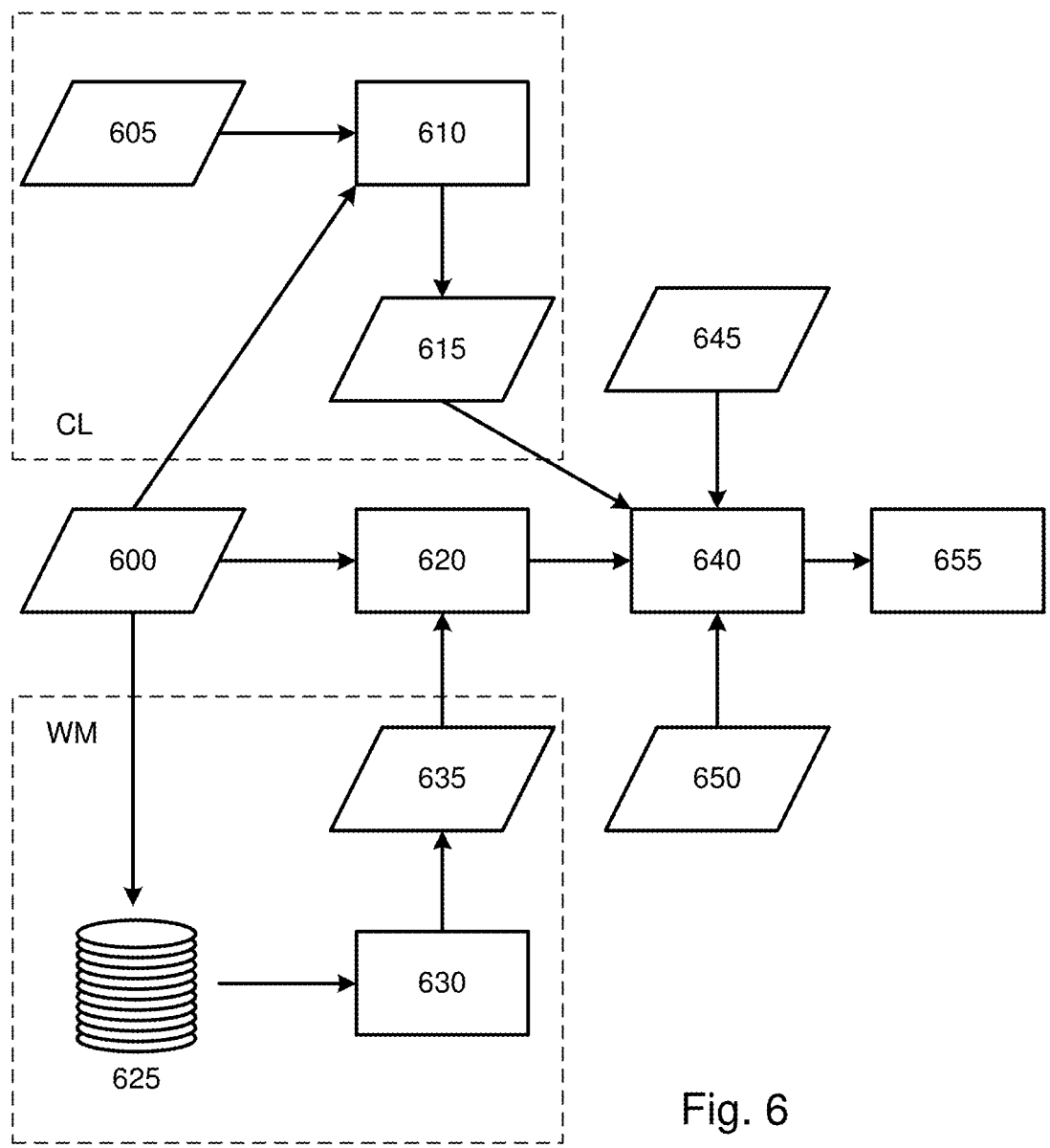
FIG. 6 is a flowchart describing a method according to some embodiments of the present disclosure.

FIG. 6 is a flowchart describing a method according to some embodiments. In a computational Lithography CL process, process condition data 600 (i.e., describing different process conditions) and multiple layer layout data 605 (e.g., post-OPC (optical proximity correction) EPE layout data for a plurality of layers) are fed into a lithography model 610, which includes modelling of crosstalk effects, local effects etc., to generate simulated contour data 615 (e.g., comprising contours per layer and process condition, sorted by process condition). Alternatively or in addition, a wafer metrology WM process may comprise exposing the layers of interest on a plurality of wafers 625 for each of the process conditions 600. Metrology 630 is then performed on these wafers (per layer), e.g., imaging and contour extraction, to obtain measured contour data 635 comprising contours per layer and process condition. The measured contour data 635 can then be stacked 620 per process condition. The stacked measured contour data 635 and/or the simulated contour data 615, along with measured and/or simulated performance data 645 (e.g. overlay data/fingerprints possibly obtained from Monte-Carlo simulation or worst case spec value) and EPE failure mode data 650 (e.g., EPE failure mode driven multi-layer constraints) is used in a step 640 of identifying and counting failures per process condition. Such a step may use a lithography manufacturability check (LMC) approach with EPE failure mode detection. The final step 655 may include one or more of:

- Hotspot detection as feature(s) violating EPE constraints at some PW location(s) (e.g., such that the process window is small);
- EPE PW determination in multi-dimensional space (e.g., F, E, OVL for layers of interest);
- EPE hotspot ranking according to their PW's;
- Overlapping PW calculation as input to process capability;
- Verification of predicted hotspot results with wafer data as feedback to simulation accuracy.

The above description makes reference to inclusion of non-scanner parameters. This will now be expanded upon. Failure mechanism EPE specific interactions between layers, such as interlayer geometry, crosstalks of contributors etc., are impacted by non-scanner components such as mask and non-lithography process steps. These put additional constraints on the EPE multi-dimensional, multi-layer process window and hotspot detection and ranking. Multi-layer EPE use case hotspots may include crosstalk between layers and scanner and non-scanner parameters (the latter including, for example, mask pattern density and etch microloading effects etc.). The aforementioned multiparameter optimization in EPE control may be improved by taking into account both scanner and non-scanner parameters for hotspot prediction and detection, resulting in a safe correction or actuation space for scanner-knobs (controls) used to control EPE.

For example, intrafield static mask and possible low frequency mask dynamic variations (e.g., due to pellicle degradation) and dynamic spatial and temporal non-scanner process variations are significant EPE contributors. Therefore, there are advantages in including these in the EPE Hotspot detection approach such that they can be taken into account in defining safe correction in EPE control applications.

Therefore, a holistic EPE Failure mechanism and geometry specific hotspot detection is proposed which may be based on holistic simulation of on-wafer shapes responsive to mask and/or non-scanner patterning process variations in addition to scanner patterning process variations. Crosstalk aware simulation models (physical and/or empirical, e.g., based on machine-learning methods), which include lithography and external or non-lithography parameters may be used to predict EPE response to scanner and non-scanner parameter variation. The external/non-lithography parameters may comprise, for example, mask pattern density, pellicle transparency, etch micro-loading effects. The resultant process window may be referred to as a holistic multi-layer, multi-dimensional process window (HMPW).

Figure 7:
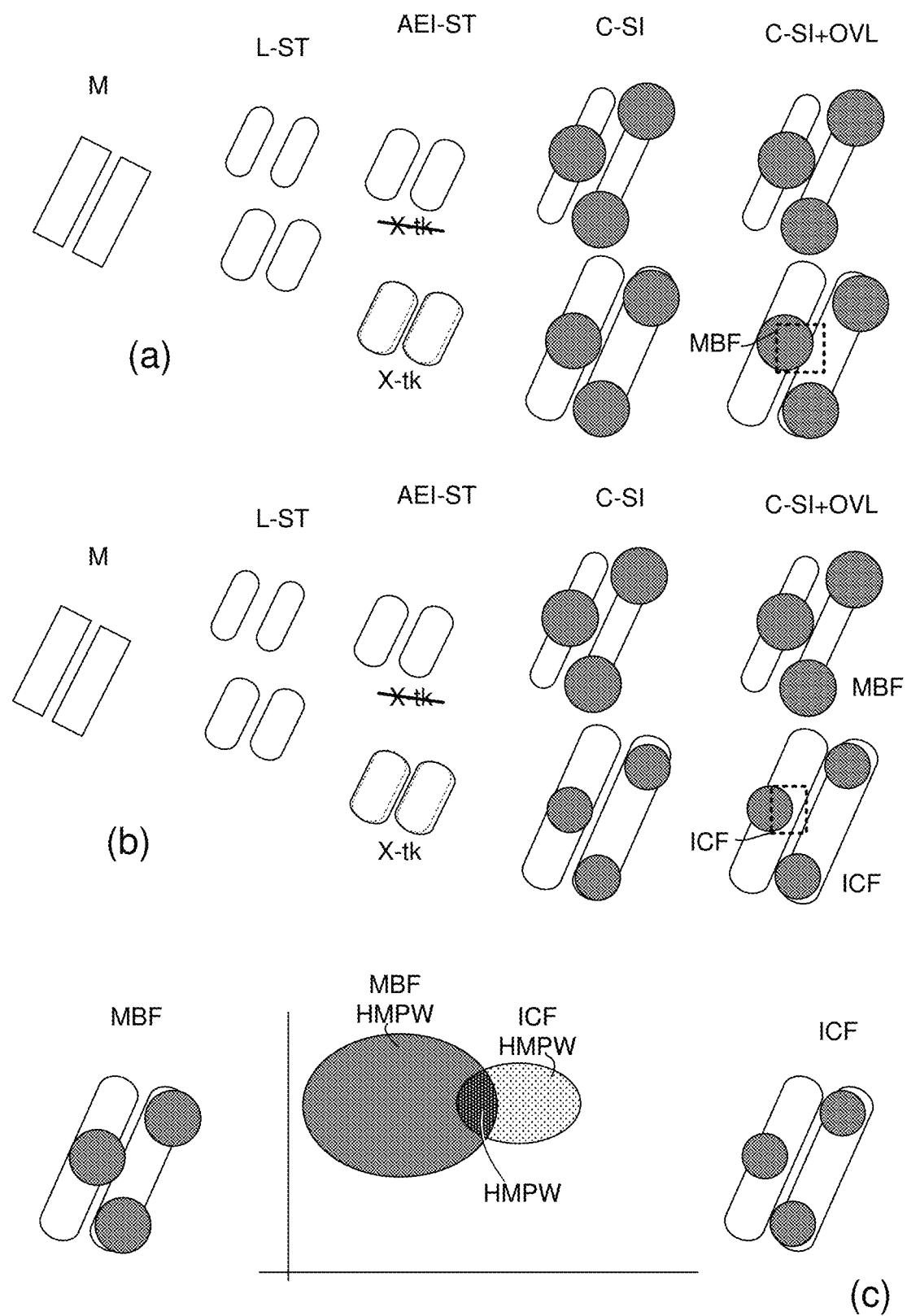
FIGS. 7(a) and (b) illustrate the issues of different failure mechanisms resultant from scanner and an external process crosstalk.
FIG. 7(c) illustrates the respective process windows and resultant overlapping process window.

FIG. 7 illustrates a use case example based on a single exposure cut of single exposure lines. In the generic case, many Lithography and non-Lithography parameters may contribute to EPE and hence be part of the HMPW. The example shows a simplified HMPW case with dose and overlay contributing to HMPW, but also accounting for Lithography-CD to etch crosstalk.

FIG. 7(a) illustrates a first hotspot and potential failure mode, which may be referred to as a "mouse bite failure" of the next AA brick. A dose error in layer A leads to the shortening of the lateral space between bricks, amplified by the etch microloading effect X-tk (crosstalk). Together with an overlay error, this leads to the mouse bite defect MBF. The Figure shows the bricks as on mask M, and the exposed bricks (after litho/pre-etch) stacked per dose condition L-ST (only two conditions shown for brevity). The next stage shows the bricks stacked AEI-ST after-etch per dose condition and an etch condition (e.g., etch time). The top figure is a no-crosstalk example and the bottom figure illustrating the effects of crosstalk (e.g., due to microloading). The superimposed hole cut step C-Si is shown for both the no-crosstalk and crosstalk examples, followed by the same step with the effect of an overlay offset added C-Si+OVL. The mouse bite failure MBF is apparent in the crosstalk and overlay affected example.

FIG. 7(b) illustrates a second hotspot and potential failure mode, which may be referred to as an incomplete cut failure ICF of the AA line. The flow and labels are essentially the same as with FIG. 7(a).

FIG. 7(c) is a simplified 2D process space diagram showing a mouse bite holistic multi-dimensional process window MBF-HMPW and an incomplete cut failure holistic multi-dimensional process window ICF-HMPW. The overlapping region is the overlapping HMPW for the process. The actual process windows may be multi-dimensional and therefore will have more than the two-dimensions of this simplified example.

Using such a HMPW, hotspot detection and ranking can be performed based on lithography and non-lithography parameters, such as focus and dose, overlay, mask CD variations, patterning process variations (e.g., litho-etch bias, spacer deposition variations etc.) etc. The HMPW aids troubleshooting by pointing to the most critical contributor to insufficient overlap between individual hotspot volumes (e.g., mask, scanner or patterning variations limiting the PW). The results help to start immediate corrective actions: e.g., volume centering and/or volume enhancement.

The proposed HMPW-based hotspot detection and ranking approach could be used to rank EPE solutions and process options (setups) by determining overlapping HMPW process window volume predicted per solution vs. cost and/or effort. This may take into account one or more of: different imaging options, mask options, overlay correction strategies, patterning process control etc.

A smart sampling and/or training using a Design of Experiments (DoE) technique may be performed to characterize the HMPW in a reasonable time.

A HMPW library may be compiled which enables interpolation and dynamic extension/learning based on data collected during wafer production and inspection. This enables previously learned knowledge to be re-used and can speed-up new HMPW development. Further embodiments which use such a library will be described later.

The flow for determining a HMPW may be similar to that illustrated in FIG. 6. The stacking step 620 is performed per HMPW condition (but not overlay), while overlay offsets/errors (measured and/or simulated) are injected at step 640, from which a new set of contours are generated prior to the failure count per HMPW condition.

The methods described above provides a multi-dimensional (e.g., FEO), multi-layer PW which is crosstalk aware. The method may be use case and failure mode specific with correct EPE detectors. Furthermore the same approach may be used for computational lithography based hotspot prediction and wafer-based hotspot verification, making their results directly comparable. The methods can provide direct input to hotspots ranking and may aid ranking of process option scenarios for EPE improvement and control. The concepts may be extended to include non-lithography parameters to determine a HMPW.

In some embodiments, the concept of a Design Aware Actuation Space (DAAS) will be described. The DAAS comprises the totality of actuator configurations (e.g., possible full trajectories of multiple actuator setpoints during exposure of the wafer) compliant to the OPW. In other words, the DAAS describes an actuation constrained subspace or process space defined by the OPW constrained by possible actuator configurations (i.e., what can actually be actuated).

For example, an EUV scanner may use, for actuation in reticle stage/wafer stage positioning, exposure dose and one or more tunable mirror elements to compensate for external disturbances in the manufacturing process. Presently, the scanner performs actuator range aware optimization of all actuators on the fly, including all in-situ metrology input (alignment/levelling). Actuator range awareness is provided to the optimizer by the scanner. The optimizer creates a "Correction recipe" without knowledge of in-situ metrology input. The optimizer uses fingerprints based on the relevant process context and the actuator ranges provided by the scanner for the desired corrections per field. Actuator ranges may be determined based on software release/patch and commercial interface option on the scanner.

As has been described, process correction may aim at controlling edge placement error (EPE). This error can be controlled by a combination of traditional overlay, focus, dose and aberration actuators. For example, a high NA EUV system may use scanning mirror actuation in combination with scanning stages. Such actuation may provide many correction possibilities but may result in other effects such as MSD errors (e.g., fading) and higher order aberrations which might reduce the image performance if not avoided.

Potentially, an actuator may move outside the range (e.g., PW) where all product features (in particular hotspots) always print; there is no intrinsic mechanism in place to enforce hotspot printability. Process windows of all hotspots (e.g., an overlapping PW, OPW) may be calculated using known methods or methods disclosed above (e.g., a multi-layer OPW). The OPW may be a multi-dimensional parameter space (e.g., dose, focus, MSD, aberrations etc.) for which all hotspots print.

The (e.g., on the fly) actuator configuration of the scanner should comply with the OPW. Fingerprint information may optionally be added to anticipate the effect of actuator changes on dynamics (e.g. MSD) and field-to-field/intra-field variations, putting additional constraints to the actuation solution. As such, the DAAS comprises the OPW constrained by the possible actuator configurations compliant to the OPW.

The totality of actuator configurations (full trajectories of multiple actuator setpoints during exposure of the wafer) compliant to the OPW is called the Design Aware Actuation Space (DAAS). The DAAS may be used as part of a constrained optimization problem for determining the control input to the actuators.

As such, a method for configuring a plurality of actuators may comprise the steps of: obtaining a volume within a control parameter space associated with an expected compliance to a processing requirement; determining a subset of the volume based on actuation constraints imposed by the plurality of actuators; obtaining a configuration of the plurality of actuators comprising actuator setpoints defined in said control parameter space; and using said subset to evaluate the configuration.

Such a method may comprise performing, within the scanner, a design aware optimization of all actuators on the fly, including all in-situ metrology input (e.g., one or more of alignment data, levelling data, wavefront measurement data). Design awareness is provided to the scanner as an "optimization model" and may be provided via an application. The optimization model may comprise limits for the actuators based on (e.g., simulated) process windows for lithography. The optimization model may include the relevant fingerprints for each wafer/exposures (based on process context). Design awareness may be based on a full mask simulation using computational lithography (e.g., pre-mask tape-out) based on a hotspot list. The optimization model may optimize a per-die cost function based on the DAAS.

Data science techniques may be used for parameterization and classification of the design aware actuation space (DAAS). The DAAS may be unified with physical actuators space defined by the latest available actuator range so that it can be updated. Such a method allows compensation for drifts of non-correctable parameters with correctable parameters.

The design awareness may be implemented via an actuation space simulation using computational lithography techniques. The actuation space simulations may be performed for any number of the following control parameters: Zn (n=2, 3, 4, 5, 6, 7, 8, 10, 11 ... and higher), MSD Zn (fading due to slit integration), Dose, Pupil (shape parameters), Wavelength (multi-focal imaging), Bandwidth (contrast control).

With computational metrology, the hotspot list is tested for all actuatable combinations of the above control parameters, where actuatable may be defined as only the (combined) moves which are allowed by scanner hardware. The hotspot list may be the same as presently used for OPC of the mask and source optimization (SMO) and lithography manufacturing check (LMC) of the OPC's mask before tape-out. Alternatively it may be a multilayer hotspot list determined using any of the methods of the first aspect. The DAAS may be defined as all of the actuatable parameter combinations for which all hotspots pass.

The DAAS may be described, for example, in a parameterized way (e.g. multi-dimensional ellipse surface or splines) or as a trained neural net.

Device feature sensitivities are not part of the design aware optimization model: any combination of Zn movements is acceptable as the scanner does not make its own trade-offs. The scanner only knows sensitives of alignment and fiducial marks to translate/interpret just-in-time in-situ measurements into Zn space.

Figure 8:
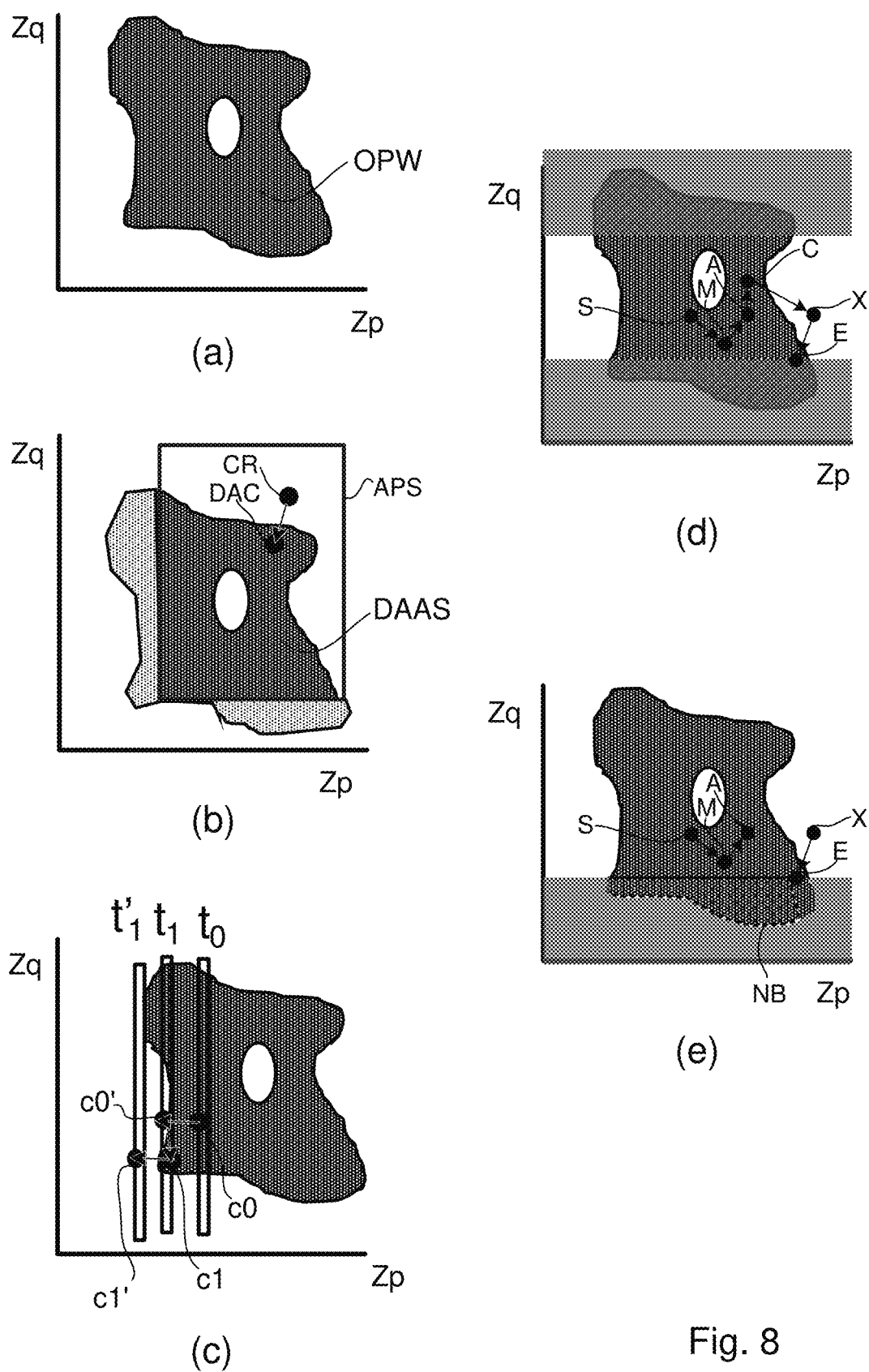
FIGS. 8(a)-8(e) each comprises a representation of a two-dimensional process space illustrating the concept of a design aware actuation space.

FIGS. 8(a) and 8(b) illustrate the concept of the DAAS. Each of these Figures shows a two-dimensional process space (Zp-Zq space). FIG. 8(a) shows an OPW (shaded region) for the Zp-Zq parameter space as determined using e.g., known techniques or a method described above. Referring to FIG. 8(b), the actuatable parameter space (actuatable combinations) is described by the box APS, i.e., those combinations within the box are actuatable. The region of overlap between the actuatable parameter space APS and the OPW is the DAAS (dark shaded).

The design aware optimization may comprise a search to find the nearest point in the DAAS. For example, the correction request (in DAAS parameters) may be represented by the point CR. The optimization may find the nearest point or design aware correction DAC within the DAAS. Such a method may comprise performing the following steps within the scanner:

Firstly, the correction request is converted to DAAS parameters. The scanner checks the latest available actuator range and unites it with DAAS range to update the DAAS. The scanner ascertains whether there is a united space or DAAS; if not the system will not be able to actuate the request and will execute a warning. Assuming that there is a DAAS, it is ascertained whether the requested correction is within the DAAS; if so, then the correction is actuated as requested. If the requested correction is not within the DAAS, the nearest accessible point in the DAAS is identified and actuated. Finally, the deviation $\vec{e}$ from the requested actuation may be reported as a warning.

FIG. 8(c) illustrates that, when a non-correctable parameter drifts so as to push the process outside the DAAS or OPW, an actuation correction t1 along another other dimension (e.g., correction via another parameter can bring the process back within DAAS.

The DAAS may comprise "non-correctable" parameters which can drift and which can be measured by in-situ metrology (e.g. a wavefront sensor on the wafer stage). In FIG. 8(c), the non-correctable parameter Zp defines a 1D DAAS t0 at a first time, with correction capability only in the Zq direction (of course, a real example may have many more dimensions). The correction c0 at time t0 is within the DAAS and therefore the OPW. Between time t0 and time t1, due to non-correctable parameter drift, the correction c0' drifts outside of the DAAS. However, a correction using parameter Zq (or a combination of more than one other parameter in a multi-dimensional example) can return the correction c1 back into the DAAS t1. If the non-correctable parameter drift is such that there is no possibility of returning a correction c1' to the DAAS t1' then a warning can be issued and the process stopped (system down).

FIGS. 8(d) and 8(e) illustrate additional (optional) optimization model refinements. For example, referring to FIG. 8(d), the optimization model within the scanner may attempt to keep the system state close to the "center" or an initial state S in the DAAS to prevent the need for sudden adjustments such as X to E, when a non-correctable parameter X moves out the region.

The shaded regions in FIG. 8(d) may represent regions where the external process fails for Zq; i.e., it represents actuation space which is not preferred due to other process step constraints (crosstalk with Zq). Drift compensation for Zp with Zq should stay away from these boundaries to leave sufficient control margin for the external process. The system, for example, can learn how to adapt the DAAS in order to be compliant to such new or additional constraints.

In case a failure of an external process was not part of the known design aware space, there is a risk that the external process (which only cares about Zq) will pick up a drift correction M and (with a delay) requests to move it back to the original state C, when the system had already corrected itself A.

FIG. 8(e) illustrates a number of options for mitigation of crosstalk with an external process. In some embodiments, it may be that the system does not compensate non-correctable parameters using correctable parameters which affect external process, but only warns when out of design aware space, as illustrated by points S, M, E. In another option, the system can learn about any new constraints of the external process and modify the Design Aware Actuator range on the fly (e.g., based on known rules or self-learning) to avoid crosstalk with external process. Such an approach may result in a new boundary NB to at least a part of the DAAS. In another option, the system can take the internal adjustments (e.g., points M, A) since the previous exposure into account (the exposure on which the external correction has been based on). The optimization model will then be aware of the state change since last exposure M, which addresses the issue raised in the preceding paragraph.

It can be appreciated that the DAAS may change if an external process or parameter changes (e.g., different etcher set-up or different OPC setting). In some embodiments, it is proposed to select an appropriate process window for a particular external configuration or setting. Such a method may comprise choosing the process window from a library of process windows, each corresponding to a particular configuration or combination of external/non-lithography parameter settings (e.g., and lithography or scanner parameter settings. As such, based on a change in an external setting (e.g., a new etcher setting or OPC setting/mask design) the appropriate process window can be selected from the library; e.g., by a controller external to the scanner. This process window can then be used by the controller or scanner to determine a DAAS (e.g., on the fly using the methods already described).

The embodiments of the present disclosure assume a suitable process window method is available which describes the multi-dimensional volume of all parameters (lithography and non-lithography) which have an impact on the edge placement error. Such a method may be the holistic multi-dimensional process window (HMPW) method as has been described, and as such, a library may be a library of HMPWs. To enable interpolation, this library can be parameterized, or trained onto a neural net or any other machine learning technique that can classify the multi-dimensional process window volume.

Figure 9:
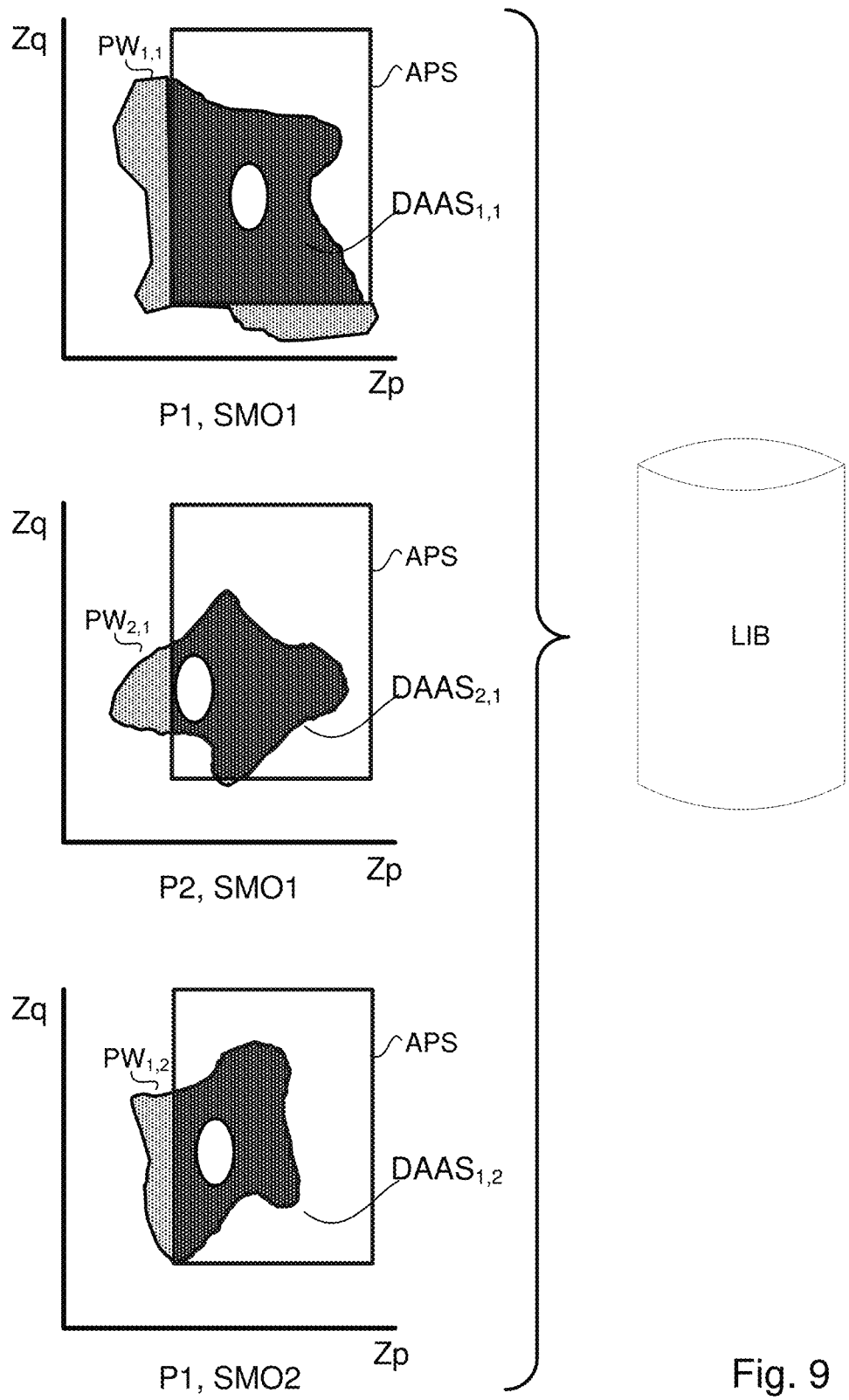
FIG. 9 illustrates the concept of a holistic multi-dimensional process window library.

FIG. 9 illustrates such an arrangement. A first process window $PW_{1,1}$ (the sum of the shaded regions) and therefore $DAAS_{1,1}$ (the darker shaded region) is shown which relates to a first setting of an external process parameter P1 and a source mask optimization parameter SMO1. The process window $PW_{2,1}$ and DAAS $DAAS_{2,1}$ for the same process and layer is shown to be different for a different setting of external process parameter P1. Similarly, process window $PW_{1,2}$ and DAAS $DAAS_{1,2}$ for the same process and layer is shown to be again different for a different setting of SMO parameter SMO2. A library LIB can be constructed and used which comprises process windows (e.g., HMPWs) for all relevant combinations of scanner/lithography parameters and external/non-lithography parameters, the latter including upstream parameters (e.g., those having an impact prior to exposure such as those relating to mask design and/or optimization) and/or downstream parameters (e.g., those having an impact subsequent to exposure such as those relating to further substrate processing steps such as etch steps. Each of these combinations of scanner parameter and external parameters may be described as a work point.

An appropriate (lithography and non-lithography) work point in the HMPW library and the corresponding HMPW may be selected from the HMPW library based on an acceptable EPE and expected correction capability of the relevant external processes. As such, given a HMPW, which may relate to upstream (e.g., including mask OPC/SMO parameters) and/or downstream actuators, an economically optimal working point can be defined for design aware actuator control of scanner actuators per wafer. The DAAS for scanner actuators may be adopted on the fly at the latest known process working points.

Using the specific example of OPC optimization, this is typically presently performed to minimize EPE. However, using the concepts disclosed herein, the OPC optimization may comprise balancing OPC effort (mask optimization) with EPE gain. OPC optimization is not necessarily pursued for global optimum EPE, but targeted to bring EPE within specification, e.g., OPC is a vehicle to ensure printability/yield but does not necessarily optimize EPE beyond that. This less complex/demanding OPC strategy will simplify OPC design process leading to a faster reticle design cycle and cheaper mask at the cost of an acceptable loss of performance (EPE), which is still maintained to be within the DAAS and therefore can be expected to yield. Process and design awareness during OPC could also provide a larger actuation space. Alternatively or in addition, the OPC optimization may aim to ensure that the DAAS is maximized without necessarily optimizing the performance metric further; e.g., to ensure that there is sufficient room to compensate expected variations in process or lithography equipment. In this manner the OPC optimization can enhance the correction potential of the scanner or other non-lithography apparatus. For example, by lowering the contrast/PW for one or more features which typically vary in a downstream etch process, the sensitivity to dose-offsets by the scanner might increase, which provides more compensation capability by scanner for the downstream etch process. Alternatively, the contrast/PW may be increased to allow more dose related errors in the scanner.

Given the latest mask (OPC) and upstream (UP) and downstream process (DP) working points in the HMPW library, a sub-space can be determined that contains the design aware actuator space (DAAS) for the Scanner. The scanner may perform design aware optimization of all actuators on the fly, including all other last minute in-situ metrology input (e.g., alignment/levelling) corrected for known and upstream correctable upstream disturbances (computational metrology).

Figure 10:
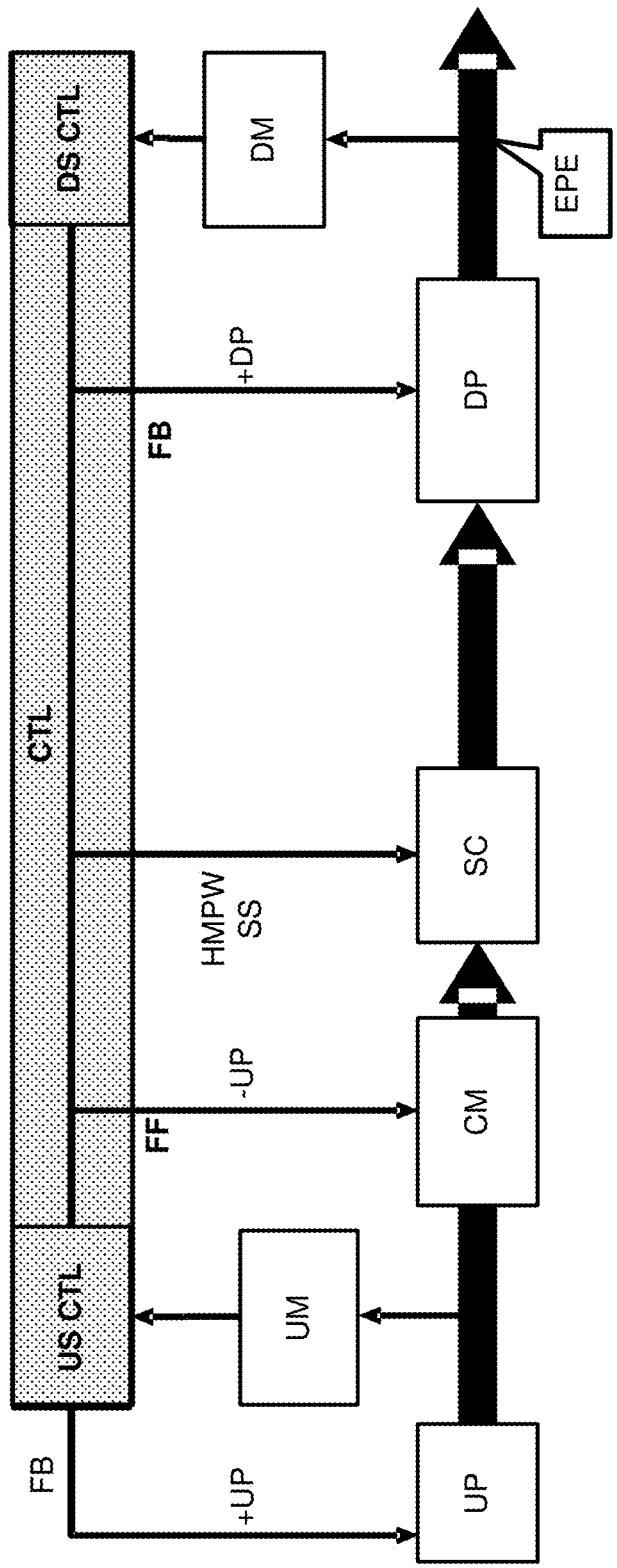
FIG. 10 is a flow diagram of a control method for a lithographic process including upstream processes, scanner processes and downstream processes.

FIG. 10 is a flow diagram describing the proposed control aspect according to embodiments of the present disclosure. The external controller CTL provides HPMW sub space HPMW SS as DAAS to the internal scanner SC control for control of the lithography process. Upstream control of one or more upstream processes UP is performed by upstream controller US CTL and downstream control of one or more downstream processes DP is performed by downstream controller DS CTL. Each of these controllers may comprise the same controller or otherwise. Data from upstream metrology UM or in-situ metrology may be fed to the external controller CTL and/or upstream controller US CTL. Computational metrology CM may be performed to determine corrections for the upstream disturbances already estimated with upstream metrology UM. Downstream metrology (e.g., AEI/ACI EPE metrology) may also be performed on the substrate after the downstream process(es) DP; the data from which may be fed to the external controller CTL and/or downstream controller DS CTL.

It may be assumed that the upstream metrology UM describes upstream process effects which can potentially be corrected by upstream and/or downstream process parameters. These contributions may therefore be removed before the data is used to control the scanner SC so as not to perform double corrections.

An upstream process UP may be compensated within the scanner SC as a feed-forward FF correction, and/or also by the upstream process UP by feedback FB on a subsequent lot. An upstream process may be, for example, mask writing.

For downstream disturbances: The upstream metrology UM does not contain any downstream related disturbances. The downstream (EPE) metrology DM contains the downstream related disturbances. Based on the downstream EPE metrology DM, the external controller CTL may make a compensation request to the scanner which comprises compensation for downstream induced disturbances not correctable (or are not to be corrected) by downstream correction mechanisms but does not comprise compensation for downstream induced disturbances which will be corrected by downstream correction mechanisms. This request may comprise a design aware actuation sub-space for generalized scanner parameters.

For upstream disturbances: The upstream metrology and downstream metrology comprises upstream related disturbances. Based on the downstream metrology DM, the external controller may make a compensation request to the scanner which comprises compensation for upstream induced disturbances not correctable (or are not to be corrected) by upstream or downstream correction mechanisms but does not comprise compensation for upstream induced disturbances which will be corrected by upstream and/or downstream correction mechanisms. Again, the request may be a design aware actuation sub-space for generalized scanner parameters.

Based on upstream metrology, the computational metrology CM may make an (on the fly) correction request to the scanner SC which comprises compensation for upstream induced disturbances not correctable (or are not to be corrected) by upstream or downstream correction mechanism but does not contain compensation for upstream disturbances which are included in a request already requested by the external controller.

Figure 11:
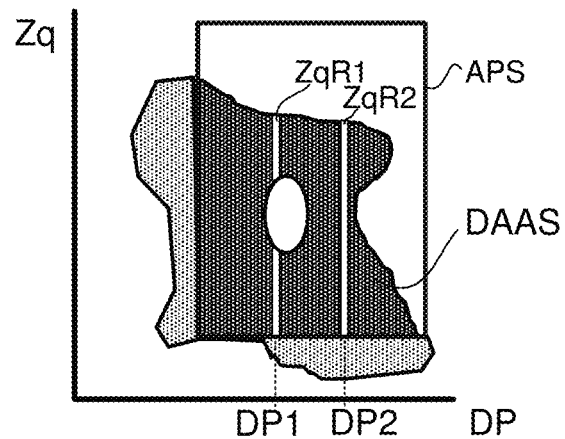
FIG. 11 comprises (a) a process space plot of a scanner parameter and a downstream parameter and (b) a flow diagram illustrating how a scanner allowable range (actuation space or DAAS) varies with the downstream parameter setting.
Figure 11:
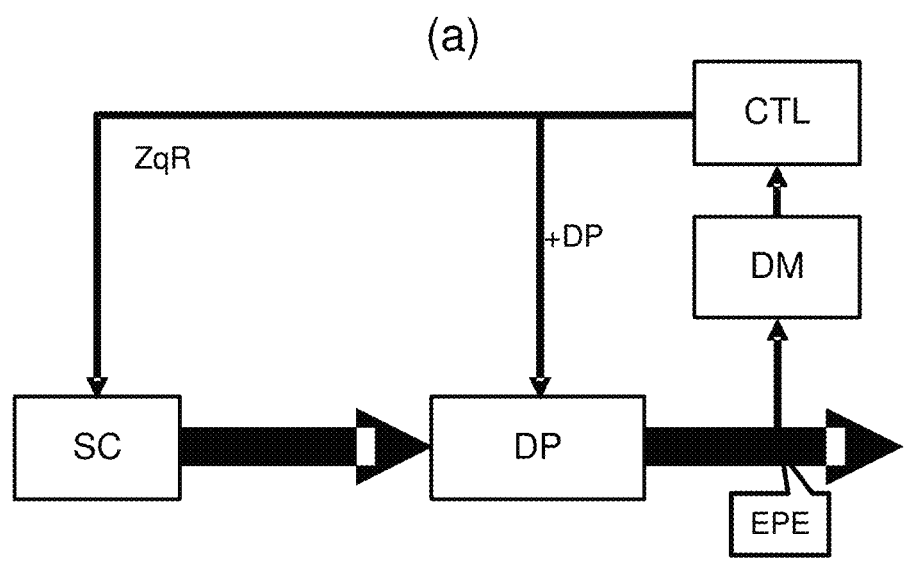

FIG. 11 illustrates a particular control aspect according to embodiments of the present disclosure. FIG. 11(a) is a process space plot of a scanner parameter Zq against a downstream parameter DP. It can be seen from this plot that a change in value for the downstream parameter (or more generally any external parameter); e.g., from value DP1 to DP2 results in a different allowable actuation range, respectively ZqR1, ZqR2, for the scanner parameter (as indicated by the white lines corresponding to each value). Therefore the external control sets the working point for the downstream parameter. This sets the actuation range ZqR1, ZqR2 for scanner parameter.

Referring to the flow diagram of FIG. 11(b), and based on the assumption that feedback from downstream process DP will be slow, the downstream process working point is used by external controller CTL to determine scanner SC range ZqR based on a subspace of the overall design aware actuation space (HMPW). This can be done when determining a correction +DP for the downstream process DP; e.g., based on downstream metrology DM.

Further embodiments are disclosed in the list of numbered clauses below:

1. A method of determining a process window within a process space for a manufacturing process, the process space being defined by a plurality of process parameters, the process window being a subspace within the process space associated with an expected compliance to a processing requirement; the method comprising: obtaining contour data relating to features to be provided to a substrate across a plurality of layers, for each of a plurality of process conditions associated with providing the features across said plurality of layers; obtaining failure mode data describing constraints on the contour data across the plurality of layers; determining a failure count for each process condition by applying the failure mode data to the contour data; and determining the process window by associating each process condition to its corresponding failure count.
2. A method according to clause 1, wherein the process window is determined as comprising the process conditions for which the failure count meets a count criterion.
3. A method according to clause 2, wherein the count criterion is an expected zero failure count.
4. A method according to any preceding clause, wherein the contour data comprises measured contour data from exposed structures on a substrate across said plurality of layers.
5. A method according to any preceding clause, wherein the contour data comprises simulated contour data from computational simulations of exposures of structures across said plurality of layers.
6. A method according to any preceding clause, wherein each of said process conditions relates to a respective combination of said process parameters.
7. A method according to any preceding clause, wherein said plurality of process parameters comprises two or more of: focus, dose, overlay, MA, MSD, any projection aberration parameter, illumination wavelength and/or bandwidth, any etch parameter, any patterning device optimization parameter.
8. A method according to clause 7, wherein a patterning device optimization parameter comprises one or more of a parameter relating to optical proximity correction or a parameter relating to source-mask optimization.
9. A method according to any preceding clause, further comprising using said process window to identify one or more critical features from critical regions of the process window comprising or being associated with a small process window volume or area.
10. A method according to clause 9, comprising ranking said critical features in terms of the volume or area of said critical regions.
11. A method according to clause 9 or 10, further comprising determining an overlapping process window for the process as the common area or volume defined by said critical regions.
12. A method according to clause 11, further comprising using said overlapping process window to determine one or more of said process parameters as being a principal contributor limiting the process window.
13. A method according to clause 11 or 12, further comprising selecting a control strategy for the manufacturing process as one compliant with said overlapping process window.
14. A method according to clause 13, further comprising determining an overlapping process window for each control strategy of a plurality of control strategies; evaluate each control strategy based on the overlapping process windows; and making a control decision based on the evaluation.
15. A method according to clause 14, further comprising ranking the control strategies according to the volume or area of their overlapping process windows.
16. A method according to any of clauses 11 to 15, further comprising determining an actuation constrained subspace of the overlapping process window based on actuation constraints imposed by a plurality of actuators used in said manufacturing process; and determining a control strategy associated with a process condition compliant with said actuation constrained subspace of the overlapping process window.
17. A method according to clause 16, wherein said determining a control strategy comprises obtaining a configuration of the plurality of actuators defined by actuator setpoints described in said process space; and evaluating whether the configuration is compliant with said actuation constrained subspace.
18. A method according to clause 16 or 17, further comprising configuring said plurality of actuators according to the determined control strategy.
19. A method according to any of clauses 16 to 18, wherein said determining a control strategy comprises using an optimization model describing limits for the plurality of actuators.
20. A method according to clause 19, wherein the optimization model comprises fingerprints relating to exposures of each of said layers.
21. A method according to clause 19 or 20, wherein the optimization model optimizes a per-die cost function.
22. A method according to any of clauses 19 to 20, wherein the optimization model is operable to minimize drift of the process combination corresponding to the selected control strategy from a center or an initial state in the actuation constrained subspace.
23. A method according to any of clauses 19 to 22, wherein said optimization model is operable to adapt the actuation constrained subspace in order to be compliant to new or additional constraints.
24. A method according to any of clauses 19 to 23, wherein the optimization model is operable to mitigate crosstalk with an external process when selecting a control strategy, by one or more of the following methods: not compensating for drift in non-correctable parameters using correctable parameters which affect external process; learning any new constraints imposed by the external process and modifying the actuation constrained subspace accordingly; account for any changes in state since the previous exposure.

25. A method according to any of clauses 16 to 24, further comprising updating said actuation constrained subspace with a physical actuators space defined by a latest available actuator range.
26. A method according to any of clauses 16 to 25, further comprising compensating for drifts of non-correctable process parameters with correctable process parameters based on an evaluation of said actuation constrained subspace.
27. A method according to any of clauses 16 to 26, wherein said determining an actuation constrained subspace of the overlapping process window comprises: evaluating a list of critical features for all actuatable combinations of said control parameters; and defining the actuation constrained subspace as that comprising all actuatable combinations of said control parameters for which the critical features are determined to yield.
28. A method according to any of clauses 16 to 27, wherein said determining an overlapping process window is performed in advance for a plurality of different configurations to build a library of overlapping process windows; and said determining an actuation constrained subspace of the overlapping process window comprises determining the actuation constrained subspace for an overlapping process window obtained from said library corresponding to a particular configuration.
29. A method according to clause 28, wherein said configuration describes a configuration of both at least one lithographic apparatus parameter and at least one non-lithographic parameter.
30. A method according to clause 29, wherein said determining the actuation constrained subspace comprises determining the actuation constrained subspace in response to a change in the at least one non-lithographic parameter.
31. A method according to clause 29 or 30, wherein said determining the actuation constrained subspace comprises determining the actuation constrained subspace for a lithographic apparatus operable to expose a pattern on a substrate and the determining step accounts for corrections performed externally to the lithographic apparatus.
32. A method according to any of clauses 29 to 31, wherein the at least one non-lithographic parameter comprises at least one optical proximity correction parameter relating to an optical proximity correction process and said method comprises balancing optical proximity correction effort and gain in a performance metric.
33. A method according to clause 32, wherein said optical proximity correction process comprises performing an optical proximity correction process optimization which aims to ensure that the optimization metric is within specification without necessarily optimizing the performance metric further.
34. A method for configuring a plurality of actuators for actuating a manufacturing process, comprising: obtaining a process window within a process space for a manufacturing process, the process space being defined by a plurality of process parameters, the process window being a subspace within the process space associated with an expected compliance to a processing requirement;
determining an actuation constrained subspace of the process window based on actuation constraints imposed by the plurality of actuators; and determining a control strategy for said a plurality of actuators compliant with said actuation constrained subspace.
35. A method according to clause 34, wherein said determining a control strategy comprises obtaining a configuration of the plurality of actuators defined by actuator setpoints described in said process space; and evaluating whether the configuration is compliant with said actuation constrained subspace.
36. A method according to clause 34 or 35, further comprising configuring said plurality of actuators according to the determined control strategy.
37. A method according to any of clauses 34 to 36, wherein said determining a control strategy comprises using an optimization model describing limits for the plurality of actuators.
38. A method according to clause 37, wherein the optimization model comprises fingerprints relating to exposures of each of said layers.
39. A method according to clause 37 or 38, wherein the optimization model optimizes a per-die cost function.
40. A method according to any of clauses 37 to 39, wherein the optimization model is operable to minimize drift of the process combination corresponding to the selected control strategy from a center or an initial state in the actuation constrained subspace.
41. A method according to any of clauses 37 to 40, wherein said optimization model is operable to adapt the actuation constrained subspace in order to be compliant to new or additional constraints.
42. A method according to any of clauses 37 to 41, wherein the optimization model is operable to mitigate crosstalk with an external process when selecting a control strategy, by one or more of the following methods: not compensating for drift in non-correctable parameters using correctable parameters which affect external process; learning any new constraints imposed by the external process and modifying the actuation constrained subspace accordingly; account for any changes in state since the previous exposure.
43. A method according to any of clauses 34 to 42, further comprising updating said actuation constrained subspace with a physical actuators space defined by a latest available actuator range.
44. A method according to any of clauses 34 to 43, further comprising compensating for drifts of non-correctable process parameters with correctable process parameters based on an evaluation of said actuation constrained subspace.
45. A method according to any of clauses 34 to 44, wherein said determining an actuation constrained subspace of the process window comprises: evaluating a list of critical features for all actuatable combinations of said control parameters; and defining the actuation constrained subspace as that comprising all actuatable combinations of said control parameters for which the critical features are determined to yield.
46. A method according to any of clauses 34 to 45, wherein said plurality of process parameters comprise both lithographic and non-lithographic process parameters.
47. A method according to clause 46, wherein said plurality of process parameters comprises two or more of: focus, dose, overlay, MA, MSD, any projection aberration parameter, illumination wavelength and/or bandwidth, any etch parameter, any patterning device optimization parameter.

48. A method according to clause 47, wherein a patterning device optimization parameter comprises one or more of a parameter relating to optical proximity correction or a parameter relating to source-mask optimization.
49. A method according to any of clauses 46 to 48, wherein said process window is obtained from a library of process windows, each corresponding to a different configuration of said plurality of process parameters.
50. A method according to clause 49, wherein said determining the actuation constrained subspace comprises determining the actuation constrained subspace in response to a change in the at least one non-lithographic parameter.
51. A method according to any of clauses 46 to 50, wherein said determining the actuation constrained subspace comprises determining the actuation constrained subspace for a lithographic apparatus operable to expose a pattern on a substrate and the determining step accounts for corrections performed externally to the lithographic apparatus.
52. A method according to any of clauses 46 to 51, wherein the at least one non-lithographic parameter comprises at least one optical proximity correction parameter relating to an optical proximity correction process and said method comprises balancing optical proximity correction effort and gain in a performance metric.
53. A method according to clause 52, wherein said optical proximity correction process comprises performing an optical proximity correction process optimization which aims to ensure that the optimization metric is within specification without necessarily optimizing the performance metric further.
54. A method according to clause 52 or 53, wherein said optical proximity correction process comprises performing an optical proximity correction process optimization which aims to ensure that the actuation constrained subspace is maximized without necessarily optimizing the performance metric further.
55. A computer program comprising program instructions operable to perform the method of any of clauses 1 to 54, when run on a suitable apparatus.
56. A non-transient computer program carrier comprising the computer program of clause 55.
57. A processing system comprising: the non-transient computer program carrier of clause 56; and a processor operable to run said program instructions.
58. lithographic apparatus configured to provide product structures to a substrate in a lithographic process, said lithographic apparatus comprising the processing system of clause 57.
59. A lithographic apparatus according to clause 58, further comprising: a substrate stage for holding the substrate; a reticle stage for holding a patterning device; and a projection system operable to project a radiation beam patterned by the patterned device onto the substrate.

In all the above embodiments, data science methods may be used to describe/train the OPW and/or DAAS as appropriate. Such data science methods may comprise neural networks, and more specifically may include deep learning neural networks, transfer learning networks (which, for example, may transfer (similar) learning and knowledge between different process or layers etc.) or residual neural network for example.

Within this disclosure, any mention of an allowed process space or process window may comprise an overlapping process window as described and/or an N-dimensional dimensional process window (e.g., the axes may comprise one or more of focus, dose, overlay, contrast, etc.). In some embodiments, process window tracking may be employed. This comprises limiting locally one (or more) of the process window axes, thereby shifting the set point of another axis or axes. Process window tracking is described in WO2016202559, which is hereby incorporated by reference. In all cases the process window may be determined from product information or reticle design information (relating to the structures being exposed) and/or simulated design information to determine the process window information.

The terms "radiation" and "beam" used in relation to the lithographic apparatus encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description by example, and not of limitation, such that the terminology or phraseology of the present specification is to be interpreted by the skilled artisan in light of the teachings and guidance.

The breadth and scope of the present invention should not be limited by any of the above-described exemplary embodiments but should be defined only in accordance with the following claims and their equivalents.

The invention claimed is:

1. A method of determining a process window within a process space for a manufacturing process of a substrate, the process space being defined by a plurality of process parameters, the process window being a subspace within the process space associated with an expected compliance to a processing requirement, the method comprising:
    obtaining contour data of at least two layers of a plurality of layers, the contour data relating to features to be provided to the substrate across the at least two layers of the substrate, for each of a plurality of process conditions associated with providing the features across at least two layers of the substrate, wherein the obtained contour data is extracted from an image of each layer of the at least two layers of the substrate;
    obtaining edge placement error (EPE) failure mode data describing constraints on the obtained contour data across the at least two layers of the substrate, wherein the EPE failure mode data across the at least two layers includes crosstalk between layers;
    determining an EPE failure count for each process condition by applying the EPE failure mode data to the obtained contour data; and determining the process window by associating each process condition to its corresponding EPE failure count.

2. A method as claimed in claim 1, wherein the process window is determined as comprising the process conditions for which the EPE failure count meets a count criterion.

3. A method as claimed in claim 2, wherein the count criterion is an expected zero EPE failure count.

4. A method as claimed in claim 1, wherein the obtained contour data comprises measured contour data from exposed structures on the substrate across the at least two layers.

5. A method as claimed in claim 1, wherein the obtained contour data comprises simulated contour data from computational simulations of exposures of structures on the substrate across the at least two layers.

6. A method as claimed in claim 1, wherein said plurality of process parameters comprises two or more of: focus, dose, overlay, MA, MSD, any projection aberration parameter, illumination wavelength and/or bandwidth, any etch parameter, any patterning device optimization parameter.

7. A method as claimed in claim 6, wherein the patterning device optimization parameter comprises one or more of a parameter relating to optical proximity correction or a parameter relating to source-mask optimization.

8. A method as claimed in claim 1, further comprising using said process window to identify one or more critical features from critical regions of the process window comprising or being associated with a small process window volume or area.

9. A method as claimed in claim 8, further comprising ranking said critical features in terms of the volume or area of said critical regions.

10. A method as claimed in claim 8, further comprising determining an overlapping process window for the process as a common area or volume defined by said critical regions.

11. A method as claimed in claim 10, further comprising selecting a control strategy for the manufacturing process of the substrate as one compliant with said overlapping process window.

12. A method as claimed in claim 10, further comprising:
determining an actuation constrained subspace of the overlapping process window based on actuation constraints imposed by a plurality of actuators used in said manufacturing process of the substrate; and
determining a control strategy associated with a process condition compliant with said actuation constrained subspace of the overlapping process window.

13. A method as claimed in claim 12, wherein said determining a control strategy comprises obtaining a configuration of the plurality of actuators defined by actuator setpoints described in said process space, and further comprising evaluating whether the configuration is compliant with said actuation constrained subspace.

14. A method as claimed in claim 1, further comprising: determining process parameter corrections in real-time.

15. A method as claimed in claim 14, wherein the process parameter corrections are determined on a per-substrate basis.

16. A method as claimed in claim 14, wherein the process parameter corrections are determined on a per-layer basis.

17. A non-transitory computer readable medium that stores a set of instructions that is executable by at least one processor of a computing device to cause the computing device to perform operations for determining a process window within a process space for a manufacturing process of a substrate, the process space being defined by a plurality of process parameters, the process window being a subspace within the process space associated with an expected compliance to a processing requirement, the operations comprising:
obtaining contour data of at least two layers of a plurality of layers, the contour data relating to features to be provided to the substrate across the at least two layers of the substrate, for each of a plurality of process conditions associated with providing the features across at least two layers of the substrate, wherein the obtained contour data is extracted from an image of each layer of the at least two layers of the substrate;
obtaining edge placement error (EPE) failure mode data describing constraints on the obtained contour data across the at least two layers of the substrate, wherein the EPE failure mode data across the at least two layers includes crosstalk between layers;
determining an EPE failure count for each process condition by applying the EPE failure mode data to the obtained contour data; and
determining the process window by associating each process condition to its corresponding EPE failure count.

* * * * *